(12) United States Patent
Sunohara et al.

(10) Patent No.: US 8,212,355 B2
(45) Date of Patent: Jul. 3, 2012

(54) SEMICONDUCTOR PACKAGE AND MANUFACTURING METHOD OF THE SEMICONDUCTOR PACKAGE

(75) Inventors: Masahiro Sunohara, Nagano (JP); Yuichi Taguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 155 days.

(21) Appl. No.: 12/760,419

(22) Filed: Apr. 14, 2010

(65) Prior Publication Data
US 2010/0289140 A1 Nov. 18, 2010

(30) Foreign Application Priority Data
May 14, 2009 (JP) .................. 2009-117921

(51) Int. Cl.
*H01L 23/488* (2006.01)
*H01L 21/60* (2006.01)
*H01L 21/768* (2006.01)
*H01L 23/48* (2006.01)

(52) U.S. Cl. ......... 257/737; 257/E23.011; 257/E21.509; 257/E21.585; 257/E23.023; 257/773; 257/778; 257/738; 257/734; 257/686; 257/685; 257/723; 257/777

(58) Field of Classification Search .................. 257/737, 257/774, E21.509, E21.585, E23.011, E23.023, 257/773, 778, 738, 734, 686, 685, 723, 777
See application file for complete search history.

(56) References Cited

U.S. PATENT DOCUMENTS

| 7,098,535 | B2 * | 8/2006 | Lee et al. ...................... 257/738 |
| 8,053,886 | B2 * | 11/2011 | Taguchi et al. ............... 257/698 |
| 2004/0080040 | A1 * | 4/2004 | Dotta et al. .................... 257/698 |
| 2006/0055050 | A1 * | 3/2006 | Numata et al. ................. 257/774 |
| 2008/0045746 | A1 * | 2/2008 | Takamatsu et al. ........... 562/433 |
| 2009/0008747 | A1 | 1/2009 | Hoshino et al. |
| 2009/0189256 | A1 * | 7/2009 | Yoshimura et al. ........... 257/621 |
| 2010/0038772 | A1 * | 2/2010 | Taguchi et al. ............... 257/698 |
| 2011/0092065 | A1 * | 4/2011 | Yoshida et al. ............... 438/613 |
| 2011/0115955 | A1 * | 5/2011 | Okutani et al. ............... 348/300 |

FOREIGN PATENT DOCUMENTS
JP 2008-153340 7/2008
JP 2009-16773 1/2009

* cited by examiner

*Primary Examiner* — A O Williams
(74) *Attorney, Agent, or Firm* — IPUSA, PLLC

(57) ABSTRACT

A semiconductor package includes a semiconductor device, and a wiring board where the semiconductor device is mounted. The semiconductor device includes a semiconductor substrate, a piercing electrode configured to pierce the semiconductor substrate and electrically connect the wiring board and the semiconductor device, and a ring-shaped concave part provided so as to surround the piercing electrode, the ring-shaped concave part being configured to open to a wiring board side of the semiconductor substrate.

7 Claims, 20 Drawing Sheets

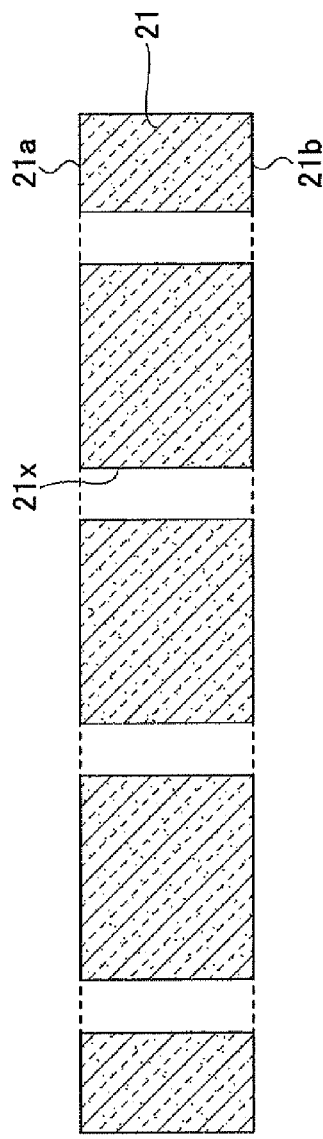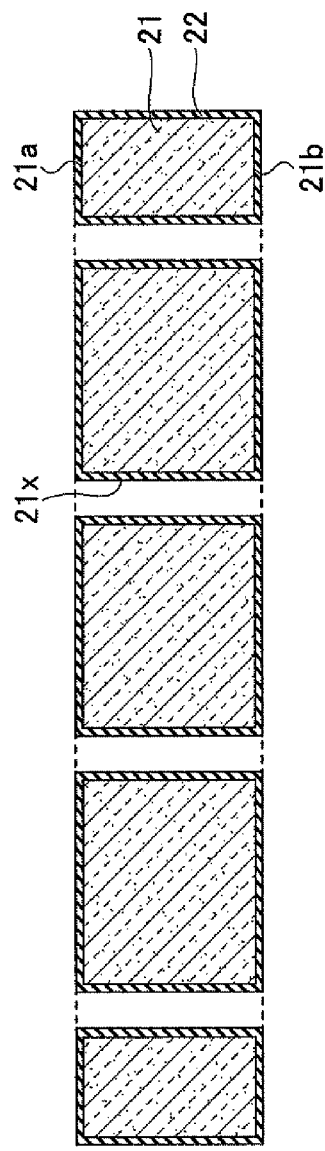

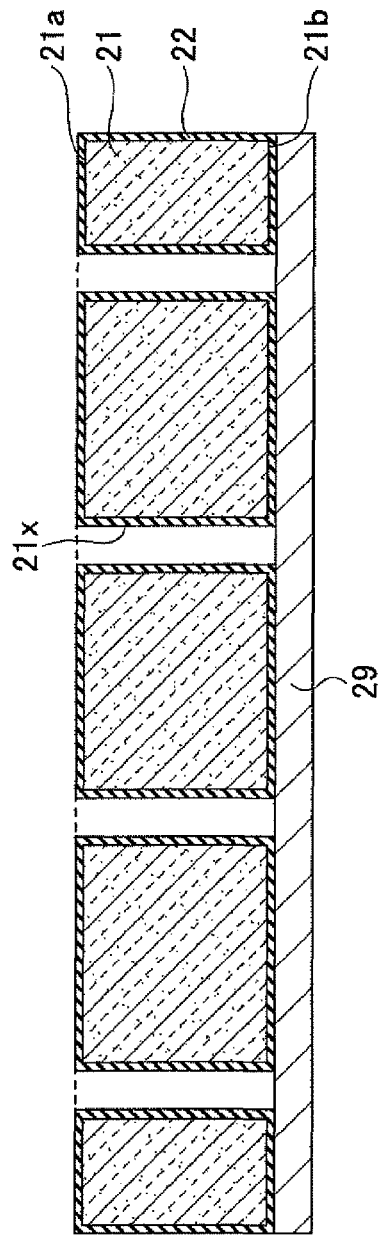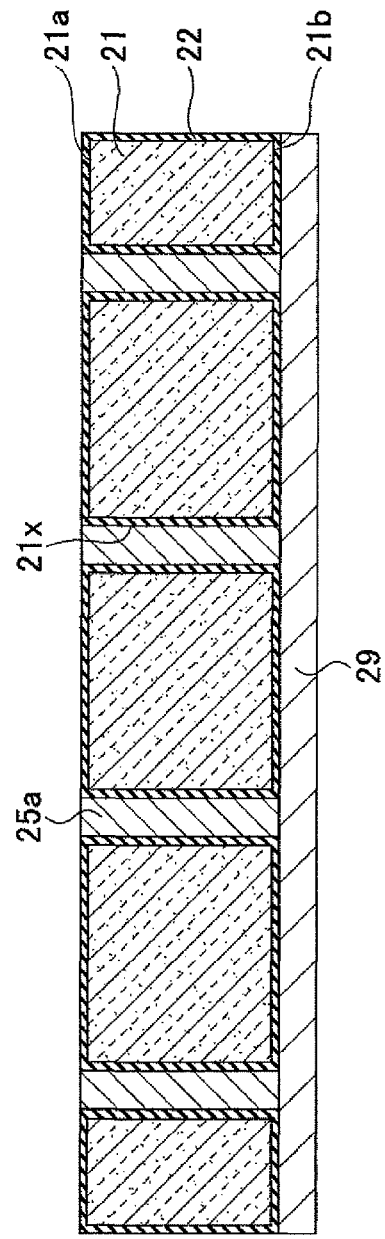

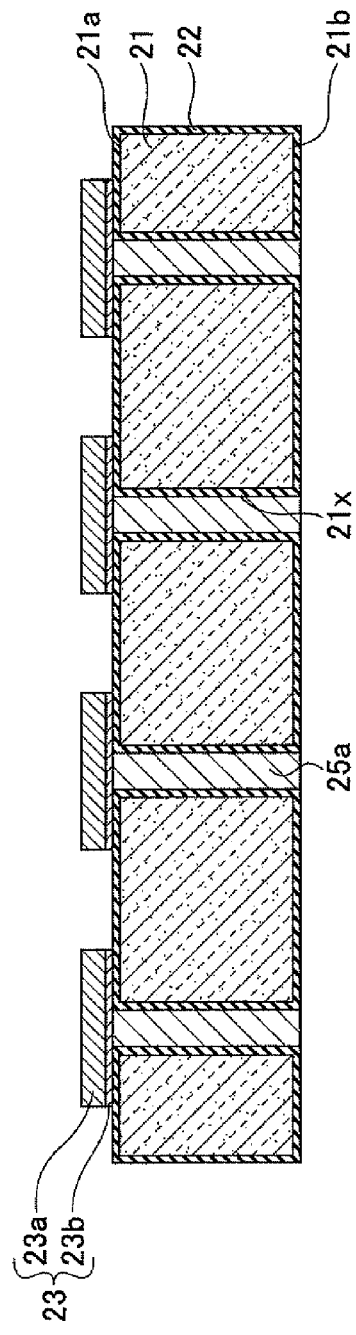
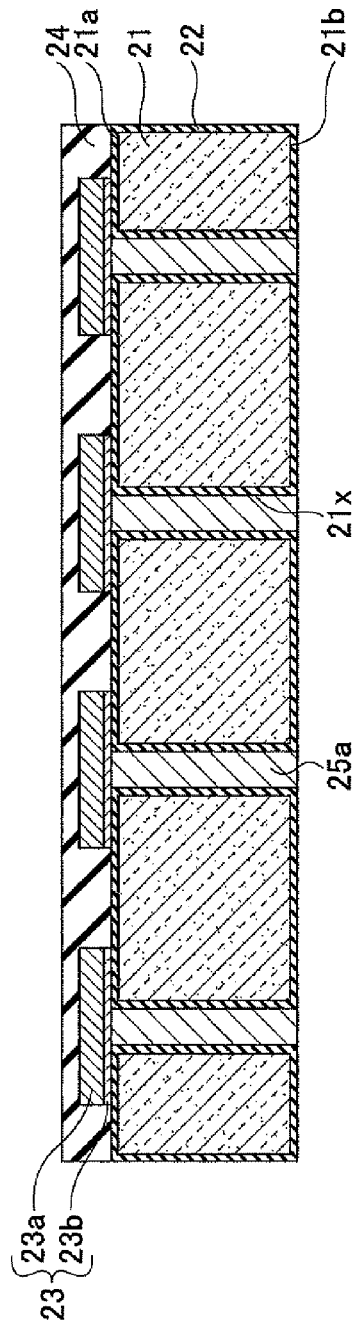

SEMICONDUCTOR PACKAGE AND MANUFACTURING METHOD OF THE SEMICONDUCTOR PACKAGE

CROSS-REFERENCE TO RELATED APPLICATIONS

This patent application is based upon and claims the benefit of priority of Japanese Patent Application No. 2009-117921 filed on May 14, 2009, the entire contents of which are incorporated herein by reference.

BACKGROUND OF THE INVENTION

1. Field of the Invention

The present invention generally relates to semiconductor packages and manufacturing methods of the semiconductor packages. More specifically, the present invention relates to a semiconductor package including a semiconductor device, and a wiring board and a manufacturing method of the semiconductor device.

2. Description of the Related Art

Conventionally, a semiconductor package where a semiconductor device is mounted on a wiring board has been known. FIG. 1 is a cross-sectional view partially showing a related art semiconductor package. As shown in FIG. 1, a semiconductor package 300 includes a semiconductor device 400 and a wiring board 500. The semiconductor device 400 includes a semiconductor substrate 410, electrode pads 420, and connecting terminals 430.

A semiconductor integrated circuit (not shown in FIG. 1) and others are formed on the semiconductor substrate 410. Silicon or the like, for example, can be used as a material of the semiconductor substrate 410. The connecting terminal 430 as an electrode is formed on the electrode pad 420. A solder bump or the like, for example, can be used as the connecting terminal 430.

The wiring board 500 includes an insulation layer 530, a wiring layer 540, and a solder resist layer 550. In the wiring board 500, the wiring layer 540 is formed on the insulation layer 530. The solder resist layer 550 having opening parts 550x is formed on the wiring layer 540. Cu or the like, for example, can be used as the wiring layer 540. As the insulation layer 530, for example, epoxy group resin, glass epoxy where glass fiber cloth is included in the epoxy group resin, or the like can be used.

The connecting terminals 430 of the semiconductor device 400 are electrically connected to portions exposed via the opening parts 550x of the wiring layer 540 of the wiring board 500. See, for example, Japanese Laid-Open Patent Application Publication No. 2008-153340 and Japanese Laid-Open Patent Application Publication No. 2009-16773.

In the meantime, the coefficient of thermal expansion of glass epoxy, which can be used as the insulation layer 530, is approximately 18 ppm/° C. The coefficient of thermal expansion of silicon, which can be used as the semiconductor substrate 410, is approximately 3 ppm/° C. Due to such a difference of the coefficients of thermal expansion, when heat is applied to the semiconductor package 300, the wiring board 500 is warped more than the semiconductor substrate 410. Therefore, stress may be generated at a connecting part in the vicinity of the connecting terminal 430, the connecting part being configured to connect the semiconductor substrate 410 and the wiring board 500 to each other. Cracks may be generated at an interface between the connecting terminal 430 and the wiring layer 540 or at a part of the semiconductor substrate 410 in the vicinity of the connecting terminal 430.

SUMMARY OF THE INVENTION

Accordingly, embodiments of the present invention may provide a novel and useful semiconductor package and manufacturing method of the semiconductor package solving one or more of the problems discussed above.

More specifically, the embodiments of the present invention may provide a semiconductor package, whereby stress generated at a connecting part configured to connect a semiconductor device and a wiring board in a case where heat is applied to the semiconductor package is eased so that generation of cracks is prevented, and a manufacturing method of the semiconductor package.

Another aspect of the embodiments of the present invention may be to provide a semiconductor package, including: a semiconductor device; and a wiring board where the semiconductor device is mounted, wherein the semiconductor device includes a semiconductor substrate, a piercing electrode configured to pierce the semiconductor substrate and electrically connect the wiring board and the semiconductor device, and a ring-shaped concave part provided so as to surround the piercing electrode, the ring-shaped concave part being configured to open to a wiring board side of the semiconductor substrate.

Another aspect of the embodiments of the present invention may be to provide a semiconductor package, including: a semiconductor device; and a wiring board where the semiconductor device is mounted via an interposer, wherein the interposer includes a substrate, a piercing electrode configured to pierce the substrate and electrically connect the wiring board and the semiconductor device, and a ring-shaped concave part provided so as to surround the piercing electrode, the ring-shaped concave part being configured to open to a wiring board side of the substrate.

Another aspect of the embodiments of the present invention may be to provide a manufacturing method of a semiconductor package where a semiconductor device is mounted on a wiring board, the manufacturing method including: a piercing hole forming step of forming a piercing hole in a semiconductor substrate forming in part the semiconductor device; a piercing electrode forming step of supplying metal inside the piercing hole so as to form a piercing electrode, the piercing electrode piercing the semiconductor substrate; and a concave part forming step of removing a part of the semiconductor substrate surrounding the piercing electrode so as to form a ring-shaped concave part, the ring-shaped concave part exposing a part of the piercing electrode, the ring-shaped concave part opening to the wiring board side of the semiconductor substrate.

Another aspect of the embodiments of the present invention may be to provide a manufacturing method of a semiconductor package where a semiconductor device is mounted on a wiring board via an interposer, the manufacturing method including: a piercing hole forming step of forming a piercing hole of a substrate forming in part the semiconductor interposer; a piercing electrode forming step of supplying metal inside the piercing hole so as to form a piercing electrode, the piercing electrode piercing the substrate; and a concave part forming step of removing a part of the substrate surrounding the piercing electrode so as to form a ring-shaped concave part, the ring-shaped concave part exposing a part of the piercing electrode, the ring-shaped concave part opening to the wiring board side of the substrate.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 3 is a first view showing a manufacturing process of the semiconductor package of the first embodiment of the present invention;

FIG. 4 is a second view showing a manufacturing process of the semiconductor package of the first embodiment of the present invention;

FIG. 5 is a third view showing a manufacturing process of the semiconductor package of the first embodiment of the present invention;

FIG. 6 is a fourth view showing a manufacturing process of the semiconductor package of the first embodiment of the present invention;

FIG. 7 is a fifth view showing a manufacturing process of the semiconductor package of the first embodiment of the present invention;

FIG. 8 is a sixth view showing a manufacturing process of the semiconductor package of the first embodiment of the present invention;

DETAILED DESCRIPTION OF THE PREFERRED EMBODIMENTS

A description is given below, with reference to FIG. 2 through FIG. 23 of embodiments of the present invention.

(First Embodiment)

[Structure of Semiconductor Package of the First Embodiment]

Figure 2:
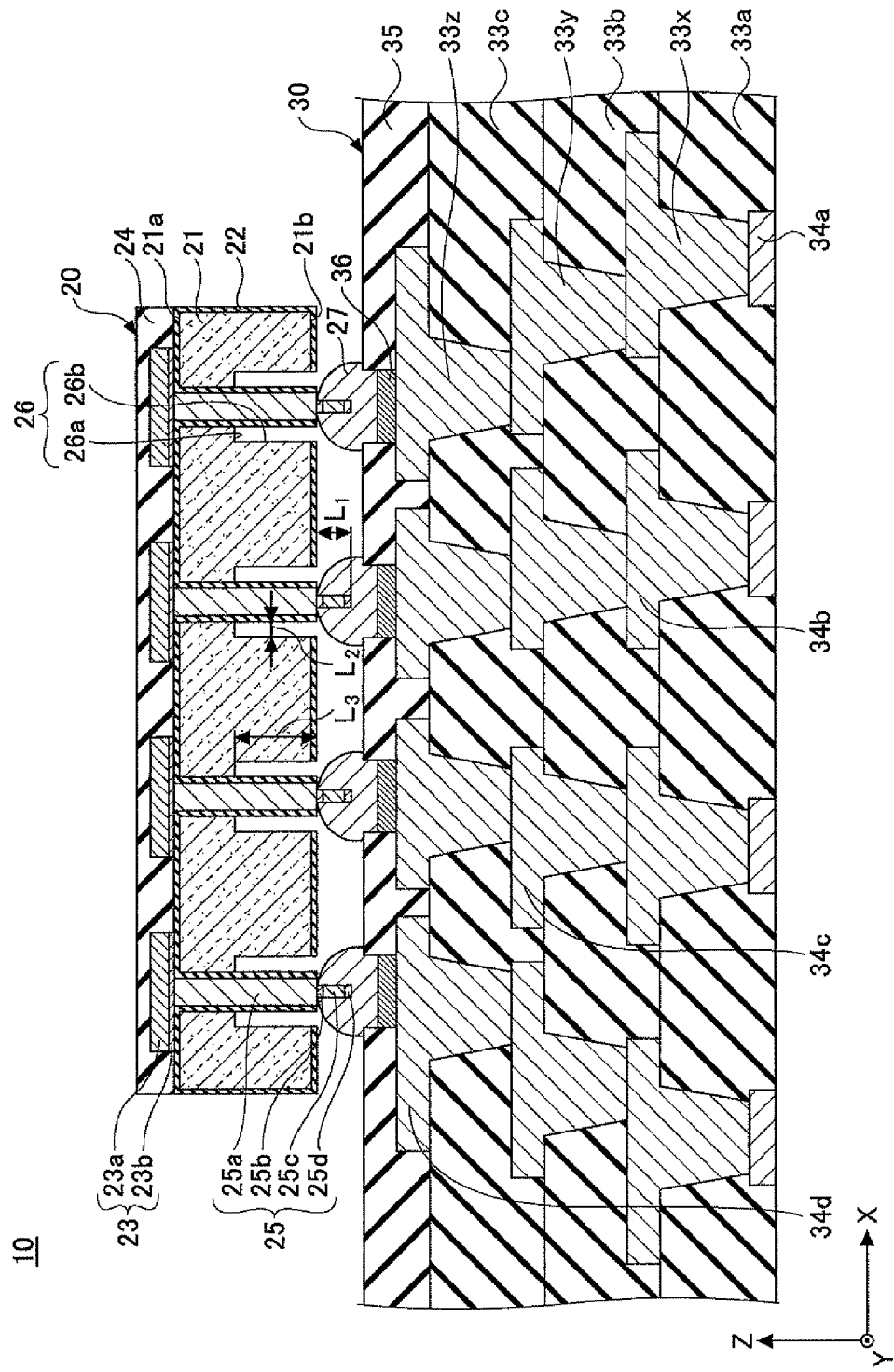
FIG. 2 is a cross-sectional view showing a semiconductor package of a first embodiment of the present invention.

First, a structure of a semiconductor package of a first embodiment of the present invention is discussed. FIG. 2 is a cross-sectional view showing a semiconductor package of a first embodiment of the present invention. In FIG. 2, an X-direction is a direction parallel with a surface 21a of a semiconductor substrate 21. A Y-direction is a direction perpendicular to the X-direction, namely a depth direction of the drawing sheet. A Z-direction is a direction perpendicular to the X-direction and the Y-direction.

As shown in FIG. 2, a semiconductor package 10 of the first embodiment of the present invention includes a semiconductor device 20 and the wiring board 30. The semiconductor device 20 includes the semiconductor substrate 21, an insulation film 22, a wiring layer 23, an insulation layer 24, piercing electrodes 25, cavity parts 26, and connecting terminals 27.

The semiconductor substrate 21 includes a semiconductor integrated circuit (not shown in FIG. 2). The semiconductor integrated circuit (not shown in FIG. 2) includes a diffusion layer (not shown in FIG. 2), a via (not shown in FIG. 2), and other parts. Silicon or the like, for example, can be used as a material of the semiconductor substrate 21. The thickness of the semiconductor substrate 21 may be, for example, approximately 200 μm. A size and a configuration of the semiconductor substrate 21 (planar view) may be a rectangular-shaped configuration where the length of the side is approximately 20 mm. Here, the planar view in this specification means a view seen in the Z-direction.

The insulation film 22 covers a surface of the semiconductor substrate 21 excluding a bottom surface 26a and a wall surface 26b of the cavity part 26. The insulation film 22 insulates between the semiconductor substrate 21 and the wiring layer 23 or the like. For example, an oxide film such as a thermal oxidation film can be used as the insulation film 22. In a case where the thermal oxidation film is used as the insulation film 22, the thickness of the insulation film 22 can be, for example, approximately 1.5 μm.

The wiring layer 23 includes a first metal layer 23a and a second metal layer 23b. The wiring layer 23 is formed on a surface 21a of the semiconductor substrate 21 via the insulation film 22. Cu or the like, for example, can be used as a material of the first metal layer 23a. The thickness of the first metal layer 23a can be, for example, approximately 5 μm. Ti or the like, for example, can be used as a material of the second metal layer 23b. The thickness of the second metal layer 23b can be, for example, approximately 100 nm.

The insulation layer 24 is formed on the surface 21a of the semiconductor substrate 21 via the insulation film 22 so as to cover the wiring layer 23. As a material of the insulation layer 24, for example, polyimide group resin or the like can be used. The thickness of the insulation layer 24 can be, for example, approximately 10 μm.

The piercing electrode 25 pierces from the surface 21a to another surface 21b of the semiconductor substrate 21. The piercing electrode 25 includes a third metal layer 25a, a fourth metal layer 25b, a fifth metal layer 25c, and a sixth metal layer 25d. One end (the third metal layer 25a) of the piercing electrode 25 is electrically connected to the wiring layer 23. Another end (the fourth metal layer 25b, the fifth metal layer 25c, and the sixth metal layer 25d) of the piercing electrode 25 projects compared to the position of the surface 21b of the semiconductor substrate 21. The projecting amount (namely a length of a projecting part) $L_1$ of the end of the piercing electrode 25 can be, for example, approximately 50 μm. The pitch of the piercing electrodes 25 can be properly selected and set to be, for example, approximately 200 μm.

The third metal layer 25a forming in part the piercing electrode 25 has a circular-shaped configuration in a planar view (seen from the surface 21a side of the semiconductor substrate 21) and having a diameter of, for example, approximately 100 μm. The fourth metal layer 25b, the fifth metal layer 25c, and the sixth metal layer 25d forming in part the piercing electrode 25 has a circular-shaped configuration in a planar view (seen from the surface 21b side of the semiconductor substrate 21) and having a diameter of, for example, approximately 50 μm. In a planar view (seen from the surface 21b side of the semiconductor substrate 21), the fourth metal layer 25b, the fifth metal layer 25c, and the sixth metal layer 25d forming in part the piercing electrode 25 are provided in the vicinity of the center part of the third metal layer 25a.

As a material of the third metal layer 25a, for example, Cu or the like can be used. As a material of the fourth metal layer 25b, for example, Ti or the like can be used. The thickness of the fourth metal layer 25b can be, for example, approximately 100 nm. As a material of the fifth metal layer 25c, for example, Cu or the like can be used. The thickness of the fifth metal layer 25c can be, for example, approximately 45 nm. As a material of the sixth metal layer 25d, for example, Au or the like can be used. The sixth metal layer 25d may be, for example, a Ni/Au layer where Ni and Au are stacked, in this order, on the fifth metal layer 25c or a Ni/Pd/Au layer where Ni, Pd, and Au are stacked, in this order, on the fifth metal layer 25c. In addition, forming the sixth metal layer 25d is not mandatory. In a case where the Ni/Pd/Au layer is used as the sixth metal layer 25d, for example, the thickness of the Ni layer can be approximately 1 μm, the thickness of the Pd layer can be approximately 1 μm, and the thickness of the Au layer can be approximately 0.05 μm.

The cavity part 26 is a ring-shaped concave part surrounding the third metal layer 25a so as to expose the insulation film 22 formed on the side surface of the third metal layer 25a forming in part the piercing electrode 25. The cavity part 26 has a ring-shaped configuration in a planar view (seen from the surface 21b side of the semiconductor substrate 21) and has an external diameter of, for example, approximately 160 μm and an internal diameter of, for example, approximately 100 μm. In this case, a width $L_2$ between a part of the semiconductor substrate 21 where the cavity part 26 is formed and the insulation film 22 formed on the side surface of the third metal layer 25a is approximately 30 μm. The width $L_2$ is not limited to 30 μm and may be approximately 10 μm through approximately 100 μm.

The cavity part 26 does not pierce the semiconductor substrate 21 and has a depth approximately half of the thickness of the semiconductor substrate 21. A depth $L_3$ of the cavity part 26 can be, for example, 100 μm. Although the depth $L_3$ may be properly set, the bottom surface 26a of the cavity part 26 should not be situated in the same position as the interface between layers (or in the vicinity of the interface between layers). For example, the cavity part 26 does not pierce the semiconductor substrate 21. This is because if the cavity part 26 pierces the semiconductor substrate 21, the bottom surface 26a of the cavity part 26 would be situated in the same position as the interface between the second metal layer 23b and the third metal layer 25a (or in the vicinity of the interface between the second metal layer 23b and the third metal layer 25a). The reason why the bottom surface 26a of the cavity part 26 should not be situated in the same position as the interface between layers (or in the vicinity of the interface between layers) is discussed below.

The connecting terminal 27 is provided on the fourth metal layer 25b, the fifth metal layer 25c, and the sixth metal layer 25d. The connecting terminal 27 is electrically connected to the wiring layer 23 via the piercing electrode 25. The connecting terminals 27 are configured to electrically connect the semiconductor device 20 and the wiring board 30 to each other. The connecting terminal 27 is electrically connected to a metal layer 36 of the wiring board 30. A solder ball, an Au bump, a conductive paste, and others can be used as the connecting terminal 27. In a case where the solder ball is used as the connecting terminal 27, for example, an alloy including Pb, an alloy of Sn and Bi, an alloy of Sn and Cu, an alloy of Sn and Ag, an alloy of Sn, Ag, and Cu, or the like can be used as a material of the connecting terminal 27.

The wiring board 30 has a built-up wiring layer including a first insulation layer 33a, a second insulation layer 33b, a third insulation layer 33c, a first wiring layer 34a, a second wiring layer 34b, a third wiring layer 34c, a fourth wiring layer 34d, a solder resist later 35, and the metal layer 36. A size and a configuration of the wiring board 30 (planar view) may be a rectangular-shaped configuration where the length of the side is approximately 40 mm.

The first wiring layer 34a is formed as a bottom layer of the wiring board 30. The first insulation layer 33a is formed so as to cover the first wiring layer 34a. The second wiring layer 34b is formed on the first insulation layer 33a. The second insulation layer 33b is formed so as to cover the second wiring layer 34b. The third wiring layer 34c is formed on the second insulation layer 33b. The third insulation layer 33c is formed so as to cover the third wiring layer 34c. The fourth wiring layer 34d is formed on the third insulation layer 33c. The first wiring layer 34a is exposed via the first insulation layer 33a so as to function as electrode pads connected to a motherboard or the like.

The first wiring layer 34a and the second wiring layer 34b are electrically connected to each other via first via holes 33x formed in the first insulation layer 33a. The second wiring layer 34b and the third wiring layer 34c are electrically connected to each other via second via holes 33y formed in the second insulation layer 33b. The third wiring layer 34c and the fourth wiring layer 34d are electrically connected to each other via third via holes 33z formed in the third insulation layer 33c.

A solder resist layer 35 having opening parts is formed so as to cover the fourth wiring layer 34d. The metal layer 36 is formed on the fourth wiring layer 34d in the opening parts of the solder resist layer 35. The metal layer 36 can be, for example, a Ni/Au plating layer where a Ni plating layer and an Au plating layer are stacked, in this order, on the fourth wiring layer 34d in the opening parts of the solder resist layer 35. The metal layer 36 and the connecting terminals 27 of the semiconductor device 20 are electrically connected to each other.

Thus, the semiconductor device 20 is electrically and mechanically connected to the wiring board 30 via the connecting terminals 27. In the meantime, since the cavity part 26 is provided at the connecting terminal 27 side of the piercing electrode 25, the connecting terminal 27 can be slightly moved in the X direction and the Y directions.

Figure 1:
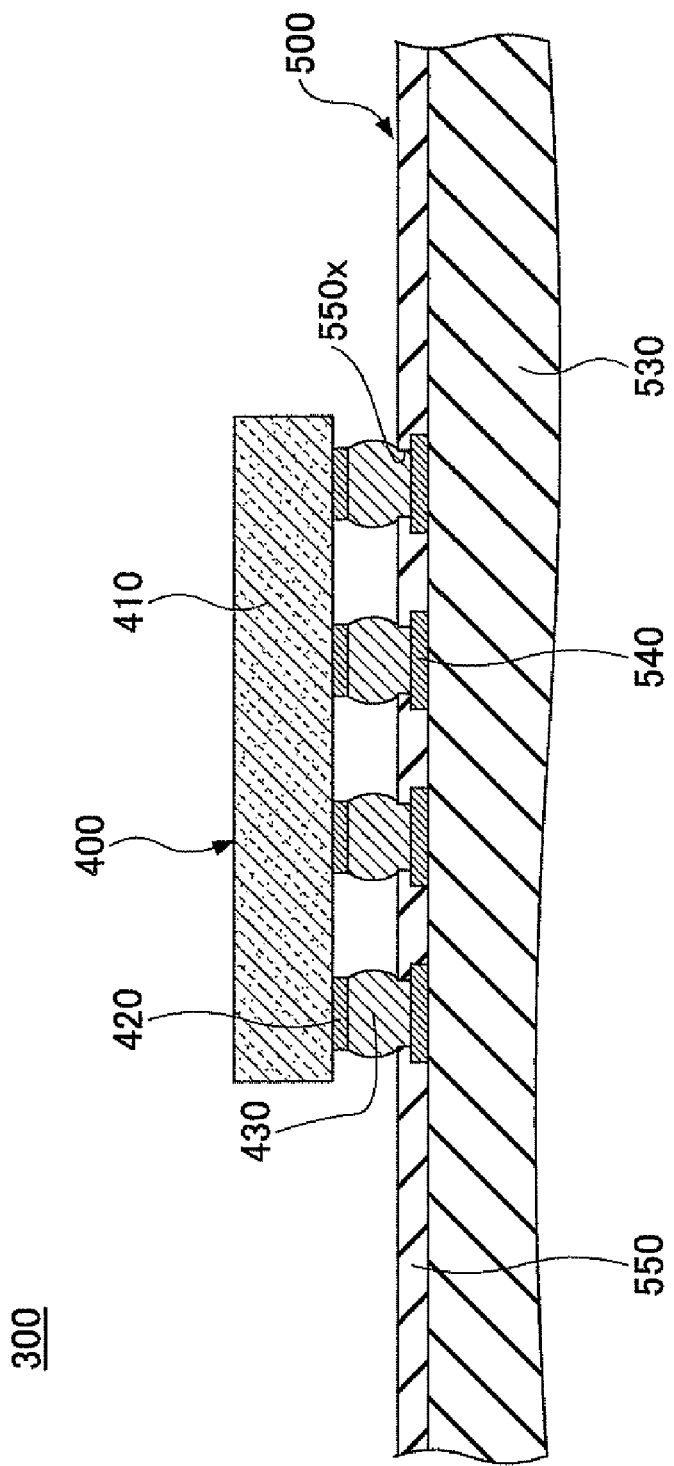
FIG. 1 is a cross-sectional view partially showing a related art semiconductor package.

As discussed above, when heat is applied to the semiconductor package 300 shown in FIG. 1, due to such difference of the coefficients of thermal expansion, the wiring board 500 is warped more than the semiconductor substrate 410. Therefore, stress may be generated at a connecting part in the vicinity of the connecting terminals 430, the connecting part being configured to connect the semiconductor substrate 410 and the wiring board 500 to each other. However, in this embodiment, since the connecting terminals 27 can be slightly moved in the X direction and the Y direction, stress generated at the connecting part (in the vicinity of the connecting terminals 27) can be drastically eased. Accordingly, it is possible to prevent cracks from being generated at the connecting part (in the vicinity of the connecting terminals 27).

[Manufacturing Method of Semiconductor Package of the First Embodiment]

Next, a manufacturing method of a semiconductor package of a first embodiment of the present invention is discussed with reference to FIG. 3 through FIG. 13. FIG. 3 through FIG. 13 are views showing the manufacturing processes of the semiconductor package of the first embodiment. In FIG. 3 through FIG. 13, parts that are the same as the parts of the semiconductor package 10 shown in FIG. 2 are given the same reference numerals, and explanation thereof is omitted.

First, in a step shown in FIG. 3, plural piercing holes 21x are formed in the semiconductor substrate 21 forming the semiconductor device 20. The piercing holes 21x pierce from the surface 21a to the surface 21b of the semiconductor substrate 21. The semiconductor substrate 21 is made of, for example, silicon. The thickness of the semiconductor substrate 21 may be, for example, approximately 200 μm.

In a case where the semiconductor substrate 21 is made of silicon, the piercing hole 21x can be formed by, for example, an anisotropic etching method such as a Deep Reactive Ion Etching (DRIE) method. The piercing hole 21x has a circular-shaped configuration in a planar view having a diameter of, for example, approximately 100 μm. The pitch of the piercing holes 21x can be, for example, approximately 200 μm. In this example, the semiconductor substrate 21 is made of silicon.

Next, in a step shown in FIG. 4, the insulation film 22 is formed so as to cover the surface of the semiconductor substrate 21 including a surface of a part of the semiconductor substrate 21 corresponding to wall surfaces of the piercing holes 21x. As the insulation film 22, for example, an oxide film (for example, thermal oxidation film) of $SiO_2$ can be used. In a case where the insulation film 22 is used as the thermal oxidation film, the thermal oxidation film can be formed by thermally oxidizing the semiconductor substrate 21 made of silicon so as to cover the surface of the semiconductor substrate 21. In a case where the insulation film 22 is used as the thermal oxidation film, the thickness of the insulation film 22 can be, for example, approximately 1.5 μm.

Next, in a step shown in FIG. 5, a metal plate 29 is adhered to a lower surface of a structural body shown in FIG. 4. The metal plat 29 functions as a feeding layer when the third metal layer 25a forming in part the piercing electrodes 25 is formed by an electrolytic plating method. As the metal plate 29, for example, a Cu plate or the like can be used.

Next, in a step shown in FIG. 6, by the electrolytic plating method where the metal plate 29 is used as the feeding layer, the plate film is deposited and grown so that the piercing holes 21x are filled with the plating. As a result of this, the third metal layer 25a forming in part the piercing electrodes 25 is formed. For example, a Cu plating film can be used as a plating film forming the third metal layer 25a.

Next, in a step shown in FIG. 7, after the metal plate 29 provided on the structural body shown in FIG. 6 is removed, the wiring layer 23 including the first metal layer 23a and the second metal layer 25b is formed. The wiring layer 23 is formed by, for example, a semi-additive method.

Details of an example where the wiring layer 23 is formed by the semi-additive method are discussed. First, by using a non-electrolytic plating method or a sputtering method, a seed layer (not shown) forming the second metal layer 23b is formed on the entirety of the surface 21a of the semiconductor substrate 21. For example, Ti or the like can be used as a material of the seed layer. The thickness of the seed layer can be, for example, approximately 100 nm. Next, a resist layer (not shown) having opening parts corresponding to the wiring layer 23 is formed on the seed layer. Then, a first metal layer 23a is formed in the opening parts of the resist layer by the electrolytic plating method where the seed layer is used as a plating feeding layer. For example, Cu or the like can be used as a material of the first metal layer 23a. The thickness of the first metal layer 23a can be, for example, approximately 5 μm.

Next, after the resist layer is removed, the first metal layer 23a is used as a mask so that the seed layer is etched and removed. As a result of this, the wiring layer 23 is obtained. As a method of forming the wiring layer 23, in addition to the above-mentioned semi-active method, various firing forming methods such as a subtractive method can be used.

Next, in a step shown in FIG. 8, the insulation layer 24 is formed on the surface 21a of the semiconductor substrate 21 via the insulation film 22 so as to cover the wiring layer 23. As a material of the insulation film 24, for example, a polyimide group resin can be used. The thickness of the insulation layer 24 can be, for example, approximately 10 μm. The insulation layer 24 can be formed by, for example, laminating a resin film so as to cover the wiring layer 23 with the resin film, then pressing the resin film, and then applying a heating treatment to the resin film at approximately 190° C. so that the resin film is cured.

Figure 9:
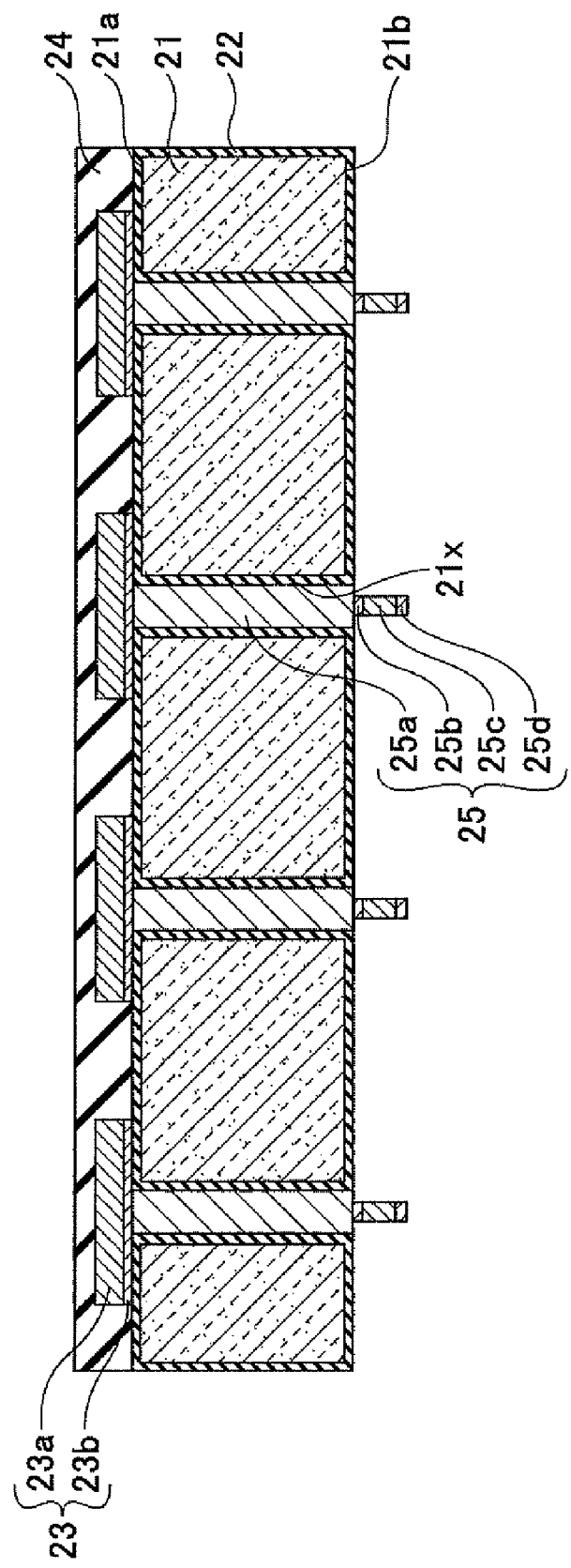
FIG. 9 is a seventh view showing a manufacturing process of the semiconductor package of the first embodiment of the present invention.

Next, in a step shown in FIG. 9, the fourth metal layer 25b, the fifth metal layer 25c, and the sixth metal layer 25d are stacked on the third metal layer 25a exposed on the surface 21b of the semiconductor substrate 21. More specifically, first, by using a non-electrolytic plating method or a sputtering method, a seed layer (not shown) forming the fourth metal layer 25b is formed on the entirety of the surface 21b of the semiconductor substrate 21 including the third metal layer 25a exposed on the surface 21b of the semiconductor substrate 21. For example, Ti or the like can be used as a material of the seed layer. The thickness of the seed layer can be, for example, approximately 100 nm.

Next, a resist layer (not shown) having an opening part corresponding to the fifth metal layer 25c and the sixth metal layer 25d is formed on the seed layer. Then, the fifth metal layer 25c is formed in the opening parts of the resist layer and the sixth metal layer 25d is formed on the fifth metal layer 25c by the electrolytic plating method where the seed layer is used as a plating feeding layer. For example, Cu or the like can be used as a material of the fifth metal layer 25c. The thickness of the fifth metal layer 25c can be, for example, approximately 45 μm. As a material of the sixth metal layer 25d, for example, Au or the like can be used. The sixth metal layer 25d may be, for example, a Ni/Au layer where Ni and Au are stacked, in this order, on the fifth metal layer 25c or a Ni/Pd/

Au layer where Ni, Pd, and Au are stacked, in this order, on the fifth metal layer 25c. In addition, forming the sixth metal layer 25d is not mandatory. In a case where the Ni/Pd/Au layer is used as the sixth metal layer 25d, for example, the thickness of Ni layer can be approximately 1 μm, the thickness of Pd layer can be approximately 1 μm, and the thickness of Au layer can be approximately 0.05 μm.

Next, after the resist layer is removed, the fifth metal layer 25c and the sixth metal layer 25d are used as a mask so that the seed layer is etched and removed. As a result of this, the fourth metal layer 25b, the fifth metal layer 25c, and the sixth metal layer 25d are stacked on the third metal layer 25a exposed on the surface 21b of the semiconductor substrate 21. Thus, the piercing electrodes 25 including the third metal layer 25a, the fourth metal layer 25b, the fifth metal layer 25c, and the sixth metal layer 25d are formed.

Figure 10:
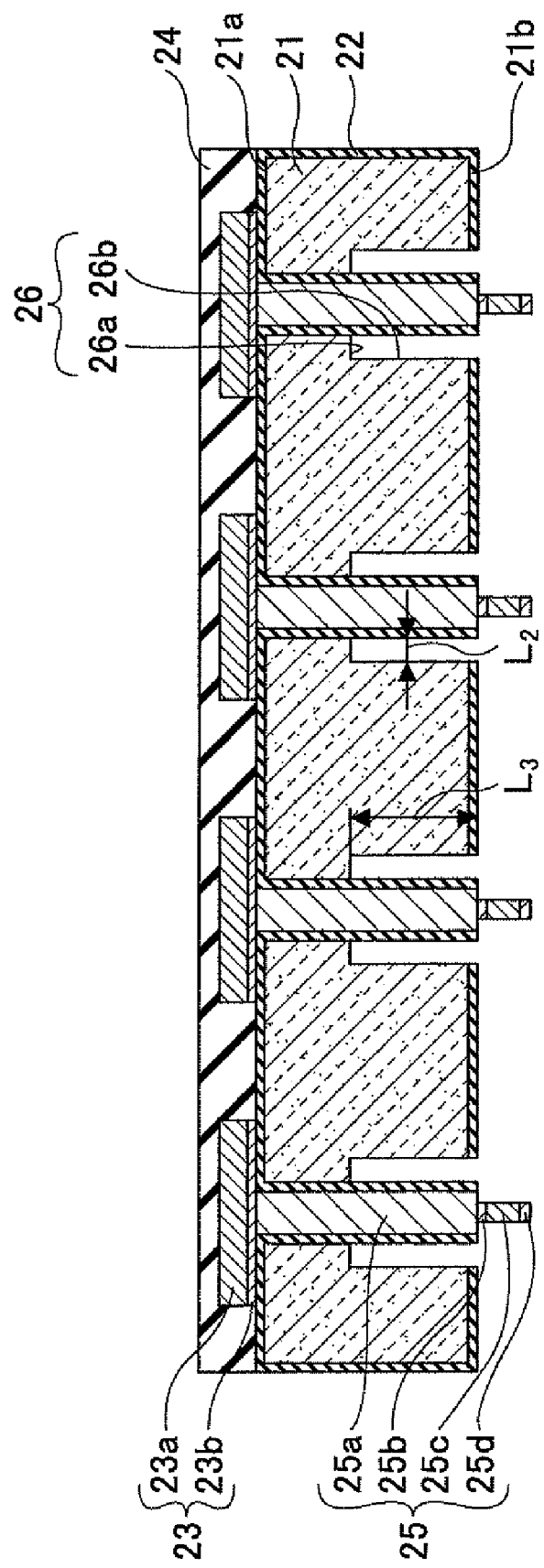
FIG. 10 is an eighth view showing a manufacturing process of the semiconductor package of the first embodiment of the present invention.

Next, in a step shown in FIG. 10, the cavity part 26 is formed so that the insulation film 22 formed on the side surface of the third metal layer 25a forming in part the piercing electrodes 25 is exposed. At this time, the insulation film 22 formed on the side surface of the third metal layer 25a remains in order to prevent the side surface of the third metal layer 25a forming in part the piercing electrodes 25 from being exposed via the cavity parts 26. This is to prevent a material forming the connecting terminals 27 entering into the cavity parts 26 when the connecting terminals 27 are formed in a step shown in FIG. 11 so that the width $L_2$ of the cavity parts 26 is maintained.

The cavity part 26 can be formed by, for example, an anisotropic etching method such as a Deep Reactive Ion Etching (DRIE) method. In order to remove $SiO_2$ of which the insulation film 22 is made, for example, $CF_4$ can be used. In order to remove silicon of which the semiconductor substrate 21 is made, for example, $SF_6$ can be used. Most of the $SiO_2$ of which the insulation film 22 is made is not removed by $SF_6$.

The cavity part 26 is a ring-shaped concave part surrounding the third metal layer 25a so as to expose the insulation film 22 formed on the side surface of the third metal layer 25a forming in part the piercing electrode 25. The cavity part 26 has a ring-shaped configuration in a planar view (seen from the surface 21b side of the semiconductor substrate 21) and has an external diameter of, for example, approximately 160 μm and an internal diameter of, for example, approximately 100 μm.

The width $L_2$ of the cavity part 26, namely a distance between a part of the semiconductor substrate 21 where the cavity part 26 is formed and the insulation film 22 formed on the side surface of the third metal layer 25a, is approximately 30 μm. The cavity part 26 does not pierce the semiconductor substrate 21 and has a depth approximately half of the thickness of the semiconductor substrate 21. The depth $L_3$ of the cavity part 26 can be, for example, 100 μm.

Figure 11:
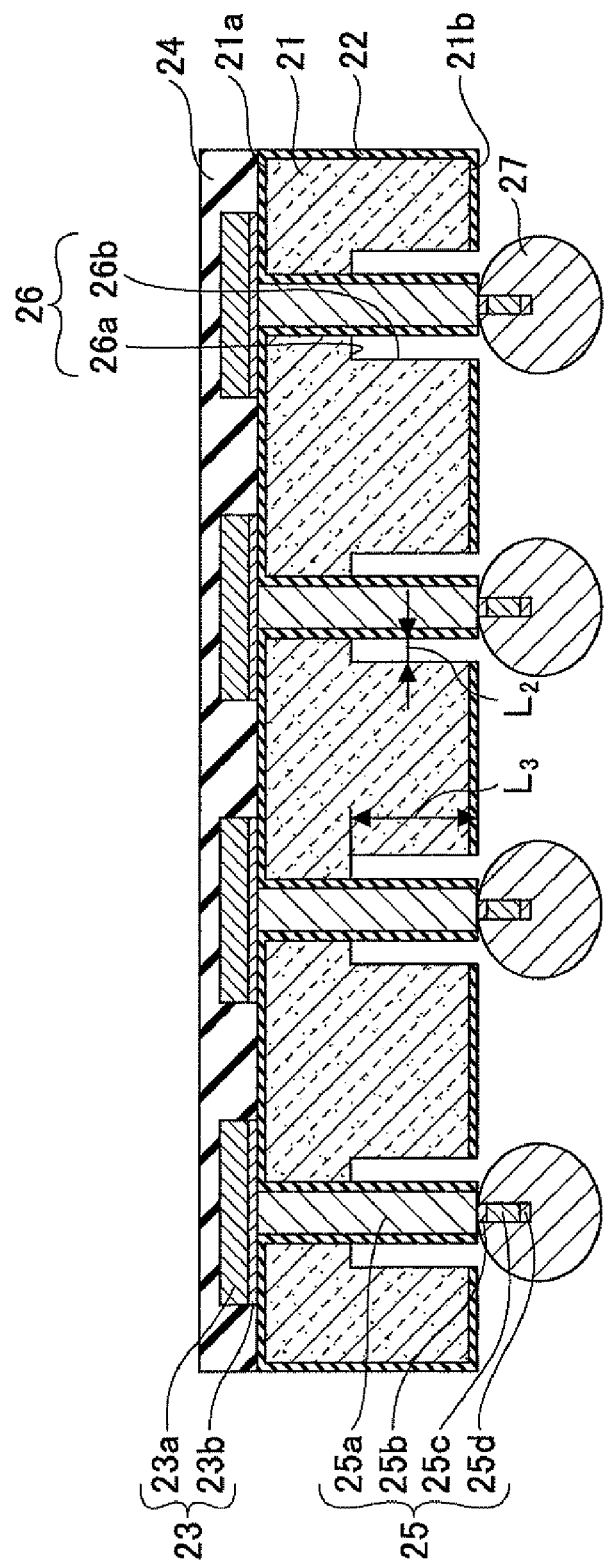
FIG. 11 is a ninth view showing a manufacturing process of the semiconductor package of the first embodiment of the present invention.

Next, in a step shown in FIG. 11, the connecting terminal 27 is formed on the fourth metal layer 25b, the fifth metal layer 25c, and the sixth metal layer 25d forming in part the piercing electrode 25. A solder ball, an Au bump, a conductive paste, and others can be used as the connecting terminal 27. In a case where the solder ball is used as the connecting terminal 27, for example, an alloy including Pb, an alloy of Sn and Bi, an alloy of Sn and Cu, an alloy of Sn and Ag, an alloy of Sn, Ag, and Cu, or the like can be used as a material of the connecting terminal 27. The connecting terminal 27 is configured to electrically connect the semiconductor device 20 and the wiring board 30 to each other.

As discussed above, a part of the third metal layer 25a forming in part the piercing electrodes 25, the part being exposed by the cavity parts 26, is covered with the insulation film 22. Therefore, the material forming the connecting terminals 27 does not enter into the cavity parts 26 when the connecting terminals 27 are being formed on the fourth metal layer 25b, the fifth metal layer 25c, and the sixth metal layer 25d forming in part the piercing electrodes 25. Hence, it is possible to keep the width $L_2$ of the cavity parts 26 to a designated value.

Figure 12:
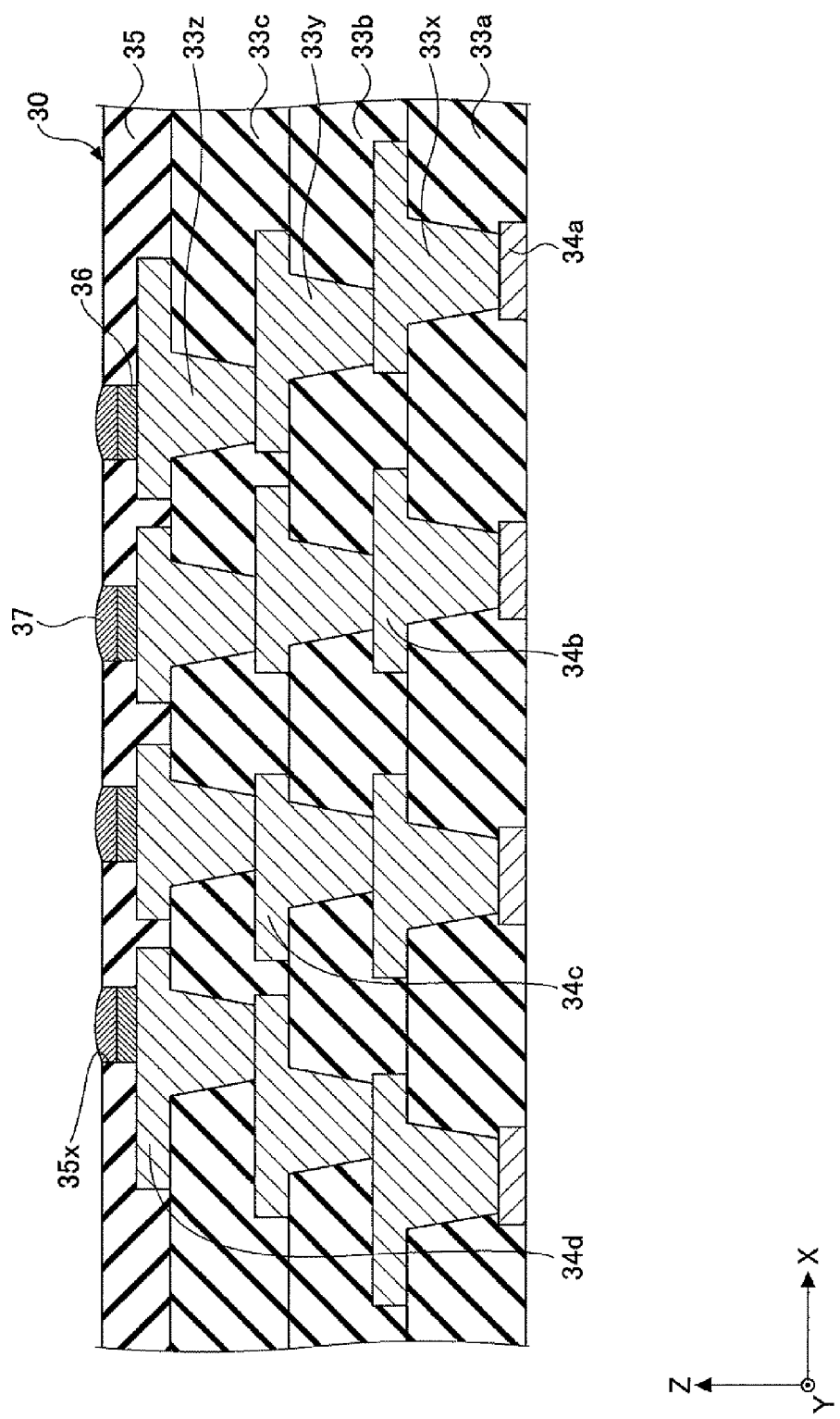
FIG. 12 is a tenth view showing a manufacturing process of the semiconductor package of the first embodiment of the present invention.

Next, in a step shown in FIG. 12, the wiring board 30 is prepared. Pre-solders 37 are formed on the metal layer 36 of the wiring board 30. The pre-solder 37 is obtained by, for example, applying a solder paste to the metal layer 36 and applying a reflow process. Since a manufacturing method of the wiring board 30 is known, explanation thereof is omitted in this specification.

Figure 13:
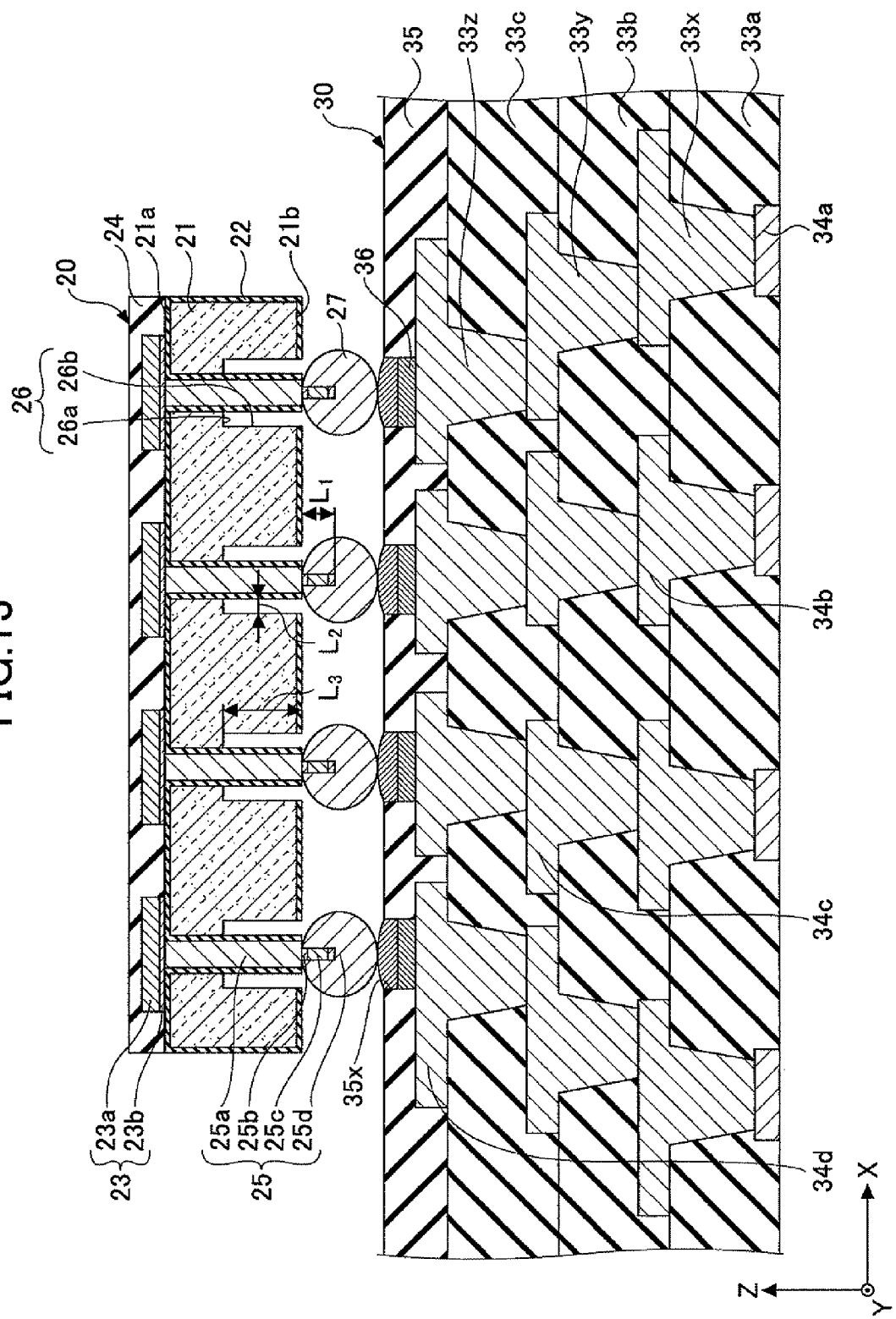
FIG. 13 is an eleventh view showing a manufacturing process of the semiconductor package of the first embodiment of the present invention.

Next, in a step shown in FIG. 13, the connecting terminals 27 of the semiconductor device 20 and the pre-solders 37 of the wiring board 30 are electrically connected to each other. The connection of the connecting terminals 27 and the pre-solders 37 is made by, for example, heating at approximately 230° C. so as to dissolve (melt) the solder. In a case where the connecting terminal 27 of the semiconductor device 20 is made of solder, the connecting terminal 27 and the pre-solder 37 are melted so as to become an alloy and therefore a single bump is formed. As a result of this, the semiconductor package 10 shown in FIG. 2 is manufactured.

[Simulation Result of Relative Strain Stress]

Figure 14:
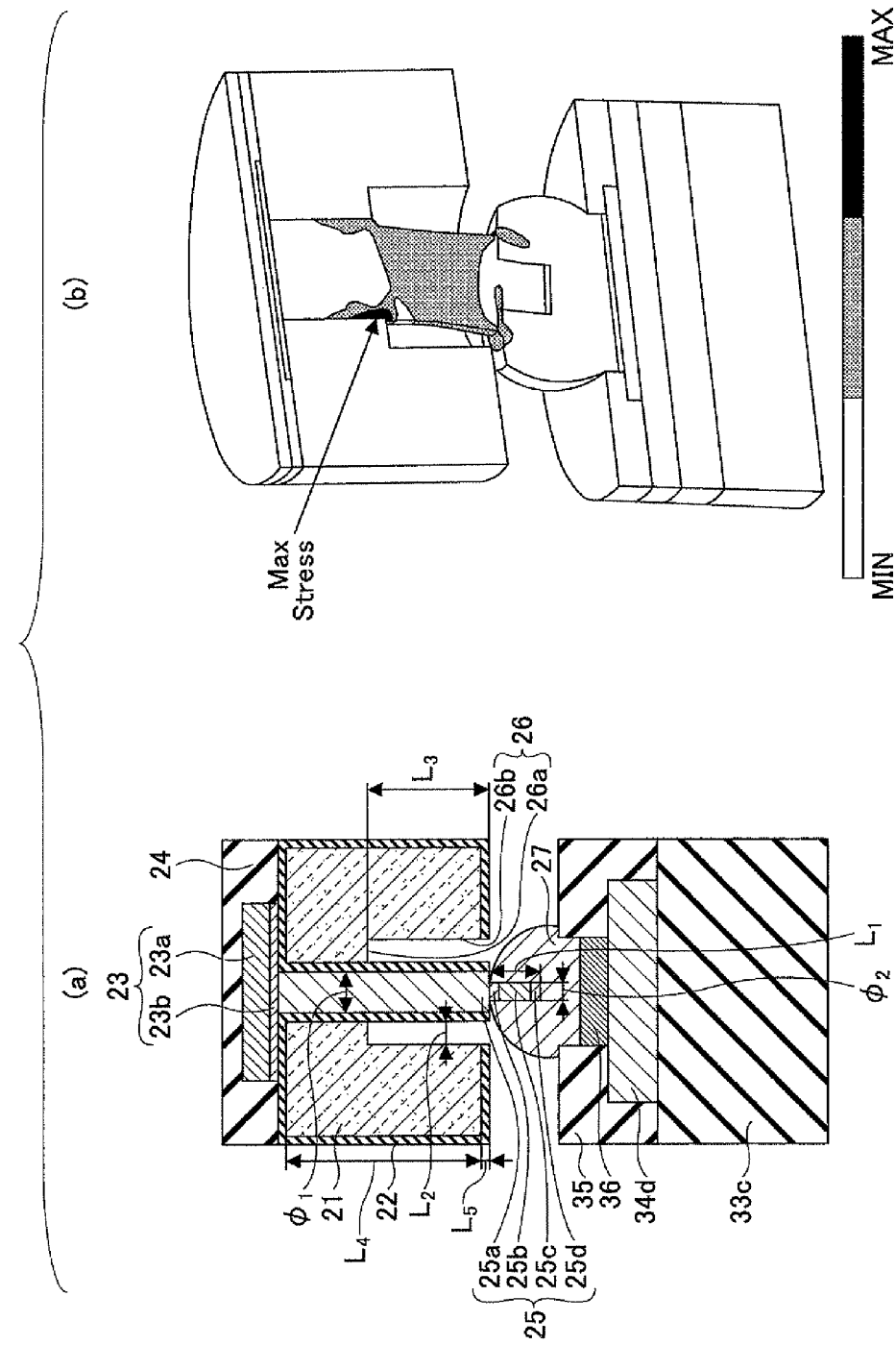
FIG. 14 is a view showing a simulation result of relative strain stress of the first embodiment of the present invention.
Figure 15:
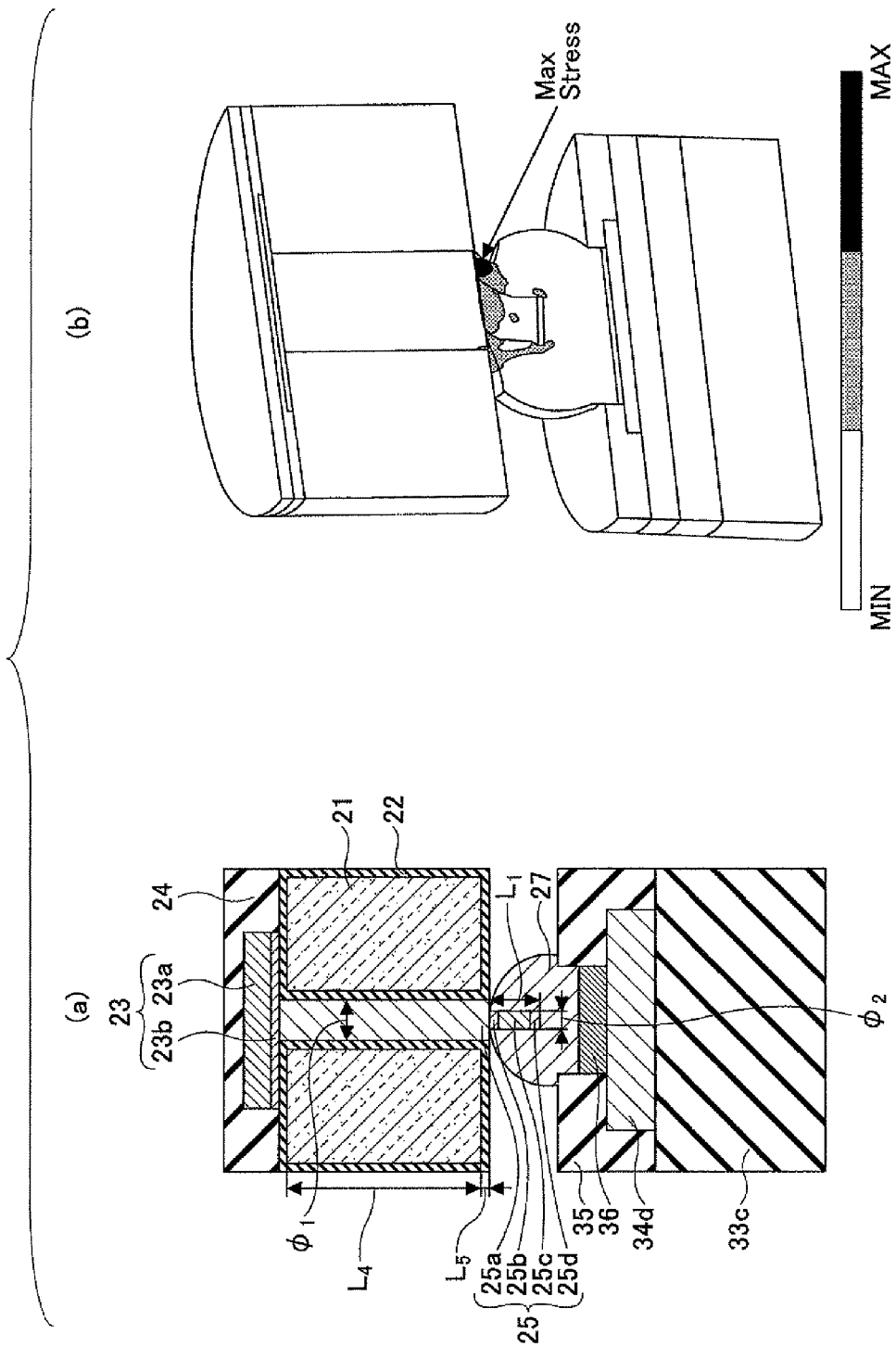
FIG. 15 is a view showing a result of relative strain stress simulation of a comparative example 1.
Figure 16:
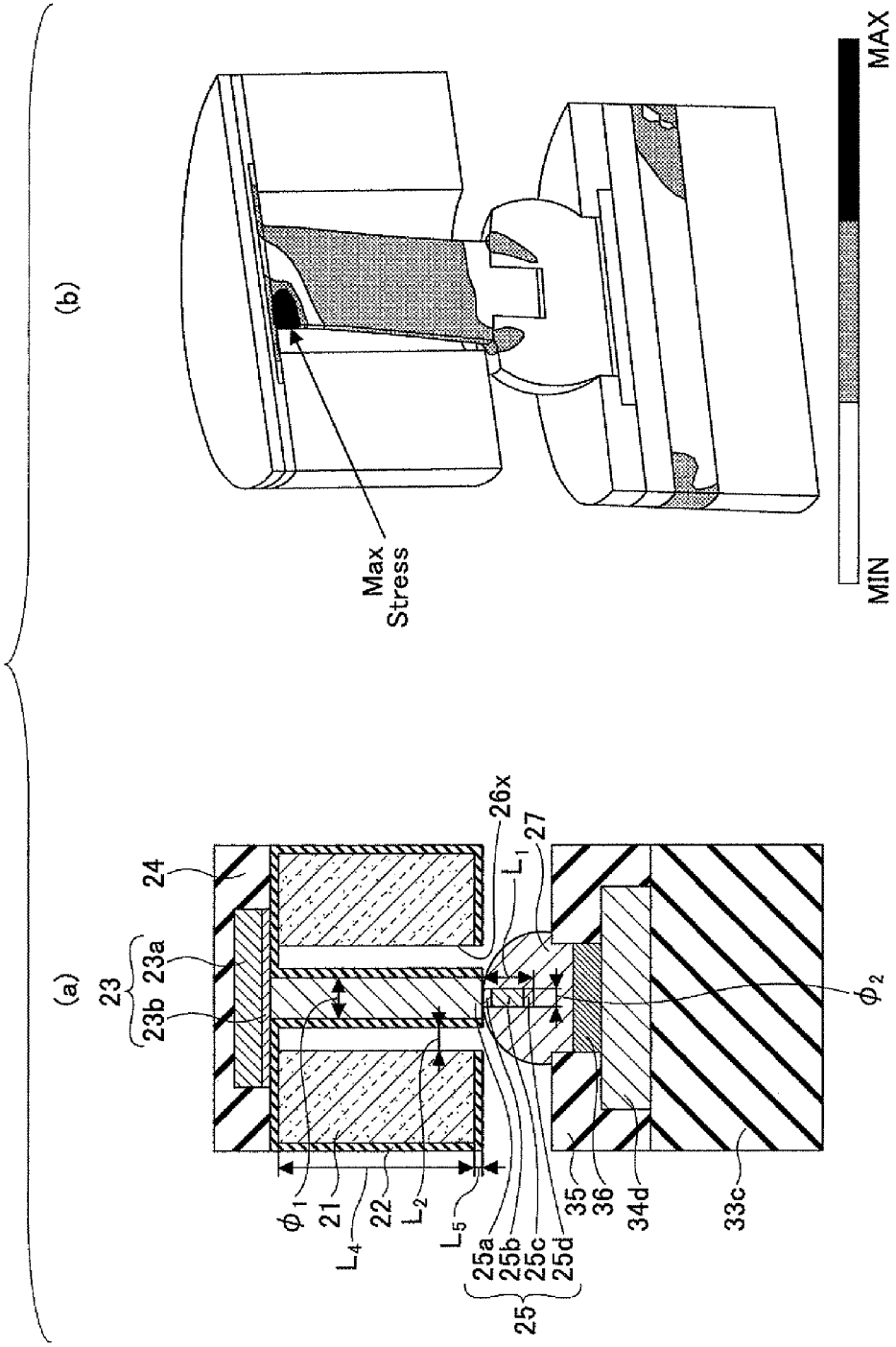
FIG. 16 is a view showing a result of relative strain stress simulation of a comparative example 2.

Next, simulation results of relative strain stresses of the semiconductor package of the first embodiment and comparative examples 1 and 2 are discussed with reference to FIG. 14 through FIG. 16. FIG. 14 is a view showing the simulation result of relative strain stress of the first embodiment of the present invention. FIG. 15 is a view showing the result of relative strain stress simulation of the comparative example 1. FIG. 16 is a view showing the result of relative strain stress simulation of the comparative example 2. The simulations of relative strain stresses shown in FIG. 14 through FIG. 16 are performed by using a finite element method.

In each of FIG. 14 through FIG. 16, (a) is a schematic cross-sectional view of a sample used for the simulation. An alloy of Sn, Ag, and Cu was used as a material of the connecting terminal 27 in the simulations. In addition, $L_1$ was set to be 50 μm; $L_2$ was set to be 30 μm; $L_3$ was set to be 100 μm; $L_4$ was set to be 200 μm; $L_5$ was set to be 1.5 μm; $\phi_1$ was set to be 100 μm; and $\phi_2$ was set to be 50 μm. In each of FIG. 14 through FIG. 16, (b) shows the result of the simulation of the relative strain stress generated when the temperature is decreased from 217° C. which is a melting point of the connecting terminal 27 to 25° C. which is room temperature. In (b) of each of FIG. 14 through FIG. 16, an arrow of "Max Stress" indicates a portion where a maximum relative strain stress is generated.

FIG. 14(a) shows a part of the semiconductor package 10 of the first embodiment shown in FIG. 2. FIG. 14(b) shows a result of the simulation of the relative strain stress where the structure shown in FIG. 14(a) was used as a sample. As shown in FIG. 14(b), a maximum relative strain stress is generated in the vicinities of the bottom surface 26a of the cavity part 26 and the side surface of the third metal layer 25a. Since an interface is not provided in the vicinity of the portion of the third metal layer 25a where the maximum strain stress is generated, the likelihood of cracks being generated at this portion is low.

FIG. 15(a) shows a part of the semiconductor package of the comparative example 1, the part equating to where the cavity part 26 is removed from the semiconductor package shown in FIG. 14(a). Other than this, the structure of the semiconductor package shown in FIG. 15(a) is the same as that shown in FIG. 14(a). FIG. 15(b) shows a result of the simulation of the relative strain stress where the structure shown in FIG. 15(a) was used as a sample. As shown in FIG. 15(b), a maximum relative strain stress is generated in the vicinities of the interface between the third metal layer 25a and the fourth metal layer 25b forming in part the piercing electrodes 25. If the maximum relative strain stress is generated in the vicinities of the interface between layers, the likelihood of cracks being generated at this portion is high.

FIG. 16(a) shows a part of the semiconductor package of the comparative example 2 where the cavity parts 26x piercing the semiconductor substrate 21 are provided instead of the cavity parts 26 shown in FIG. 14(a). Other than this, the structure of the semiconductor package shown in FIG. 16(a) is the same as that shown in FIG. 14(a). FIG. 16(b) shows a result of the simulation of the relative strain stress where the structure shown in FIG. 16(a) was used as a sample. As shown in FIG. 16(b), a maximum relative strain stress is generated in the vicinities of the interface between the third metal layer 25a forming in part the piercing electrode 25 and the second metal layer 23b forming the wiring layer 23. If the maximum relative strain stress is generated in the vicinities of the interface between layers, the likelihood of cracks being generated at this portion is high.

As shown in FIG. 14 through FIG. 16, in the semiconductor package 10 of the first embodiment, unlike the semiconductor packages of the comparative examples 1 and 2, the maximum relative strain stress is generated at a portion other than the vicinity of the interface between layers, so that it is possible to decrease the likelihood of cracks being generated at the portion where the maximum relative strain stress is generated.

[Result of S Parameter Simulation]

Next, results where S parameter simulations of the semiconductor packages of the first embodiment and the comparative example are performed are discussed with reference to FIG. 17(a) and FIG. 17(b). FIG. 17(a) shows result of S parameter simulation in a case where resistivity of the semiconductor substrate 21 is 0.1 Ω·cm. FIG. 17(b) shows result of S parameter simulation in a case where resistivity of the semiconductor substrate 21 is 10 Ω·cm. As shown in FIG. 17(a) and FIG. 17(b), line A indicates the result of S parameter simulation applied to the semiconductor package of the first embodiment shown in FIG. 14(a). Line B indicates the result of S parameter simulation applied to the semiconductor package of the comparative example 1 shown in FIG. 15(a).

Here, the S parameter indicates, as is known in the art, transmission characteristics of a four terminal network where a line of a characteristic impedance (for example, 50Ω) is connected to an input terminal and an output terminal of the four terminal network, and a high frequency signal is input. In this example, a voltage transmission coefficient S21, indicating the voltage transmitted to an output end when a voltage is applied to an input end, is used. The voltage transmission coefficient S21 indicates that as attenuation is smaller (closer to 0 dB), better high frequency characteristics are obtained.

As shown in FIG. 17(a) and FIG. 17(b), regardless of the resistivity of the semiconductor substrate 21, the semiconductor package (A) of the first embodiment has better high frequency characteristics than the semiconductor package (B) of the comparative example 1.

Figure 18:
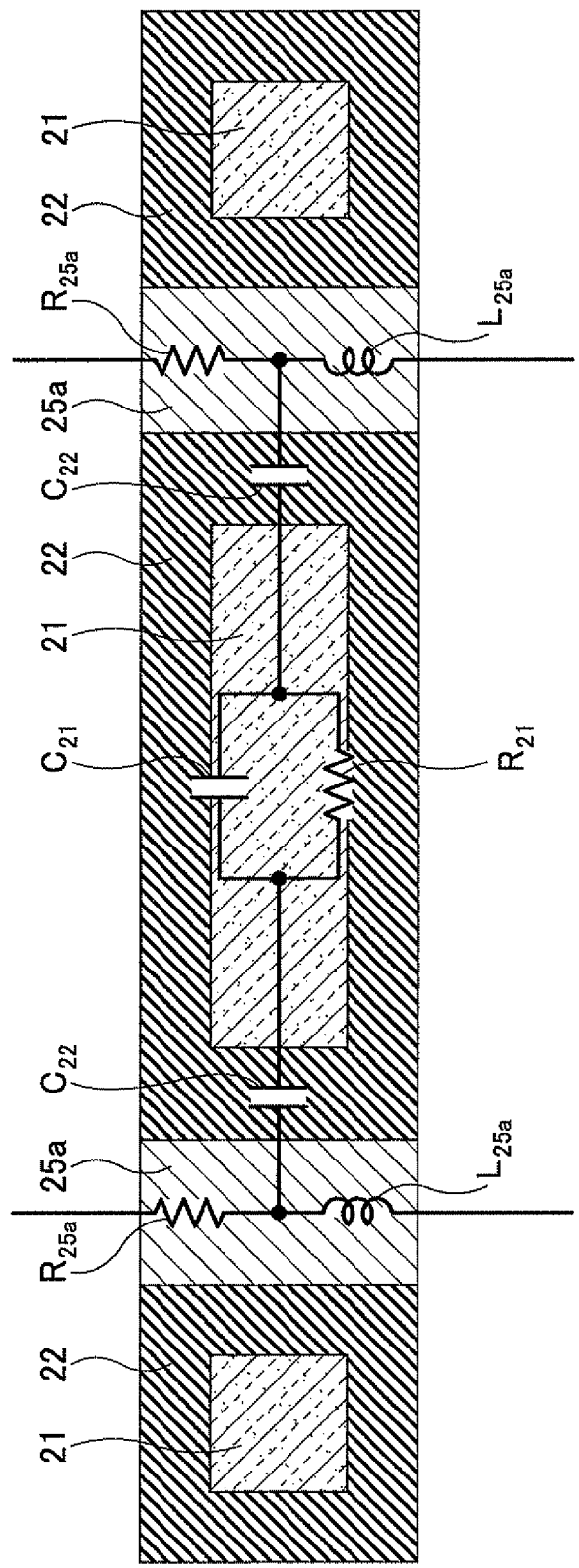
FIG. 18 is a view showing an equivalent circuit of the semiconductor package.

FIG. 18 is a view showing an equivalent circuit of the semiconductor package 10. In FIG. 18, parts that are the same as the parts shown in FIG. 2 are given the same reference numerals, and explanation thereof may be omitted. As shown in FIG. 18, an equivalent circuit of the semiconductor package 10 including the semiconductor substrate 21, the insulation film 22, and the third metal layer 25a can be represented by capacitance $C_{21}$ and resistance $R_{21}$ of the semiconductor substrate 21, capacitance $C_{22}$ of the insulation film 22, and inductance $L_{25a}$ and resistance $R_{25a}$ of the third metal layer 25a.

The third metal layer 25a and the semiconductor 21 are electrically connected to each other via the capacitance $C_{22}$ of the insulation film 22. As a result of this, the high frequency characteristics are degraded. Although the insulation film 22 may be made thick so that the capacitance $C_{22}$ may be made small in order to improve the high frequency characteristics, there is a limitation in making the insulation film 22 thick so that in reality there is difficulty.

Figure 17:
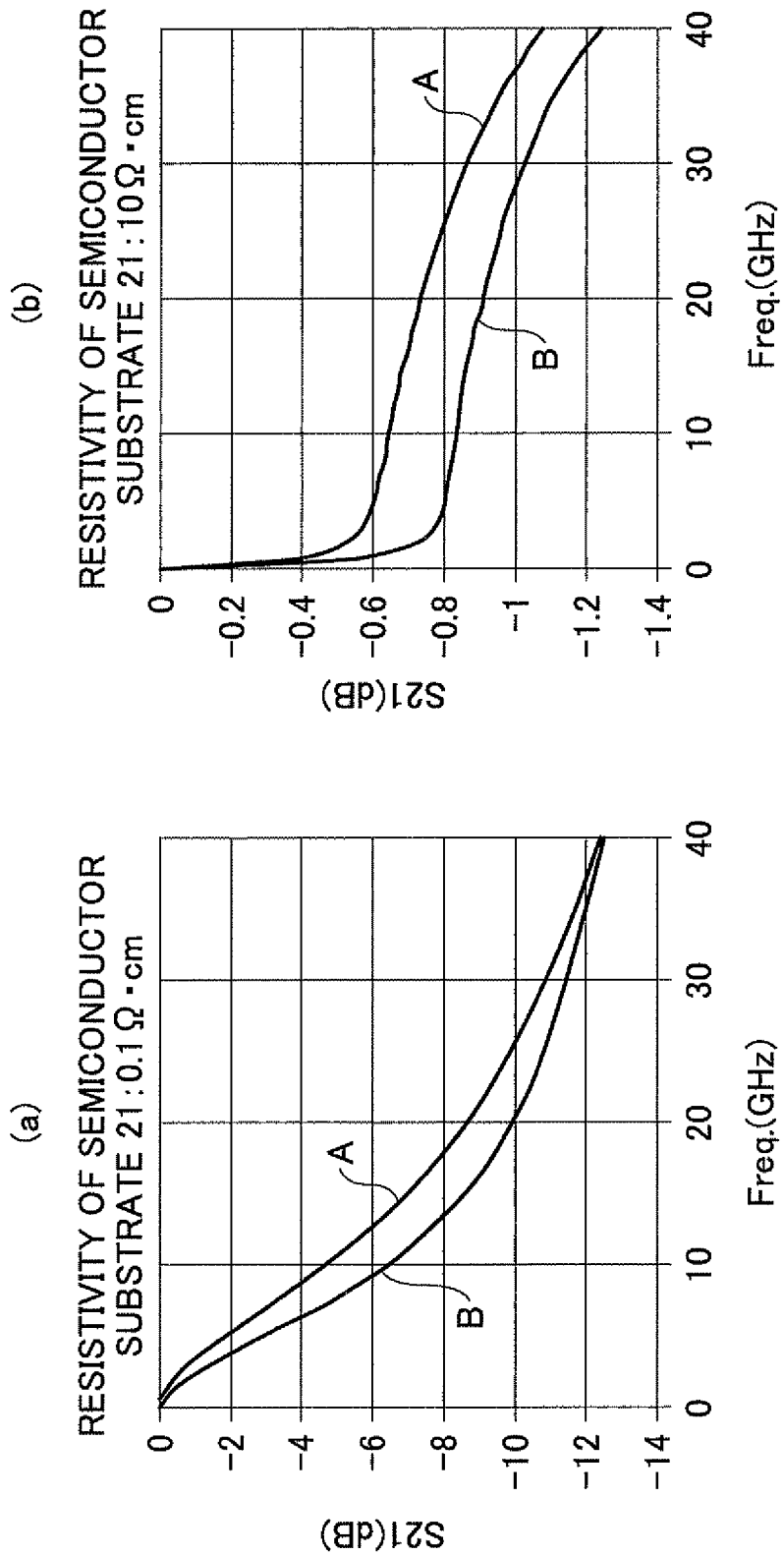
FIG. 17 is a graph view showing a result of S parameter simulation.

Instead of merely increasing the thickness of the insulation film 22, by providing the cavity parts 26 between the third metal layer 25a and the semiconductor substrate 21, as well as making the insulation film 22 thick, the capacitance $C_{22}$ can in reality be made small. As a result of this, as shown in FIG. 17, the semiconductor package having the cavity part 26 of the first embodiment has better high frequency characteristics than the semiconductor package (B) of the comparative example 1.

[Result of Capacitance Simulation]

Next are discussed results of simulation of the capacitance $C_{22}$ (see FIG. 18) of the insulation film 22 in the semiconductor package 10 of the first embodiment in a case where $L_2$ shown in FIG. 14(a) is changed. FIG. 19(a) shows results of capacitance simulation in a case where the resistivity of semiconductor substrate 21 is 100 Ω·cm. FIG. 19(b) shows results of capacitance simulation in a case where the resistivity of semiconductor substrate 21 is 0.1 Ω·cm. In FIG. 19(a) and FIG. 19(b), the width $L_2$ is changed to 0 μm, 10 μm, 30 μm, and 60 μm. "$L_2$=0 μm" represents a state shown in FIG. 15(a).

Figure 19:
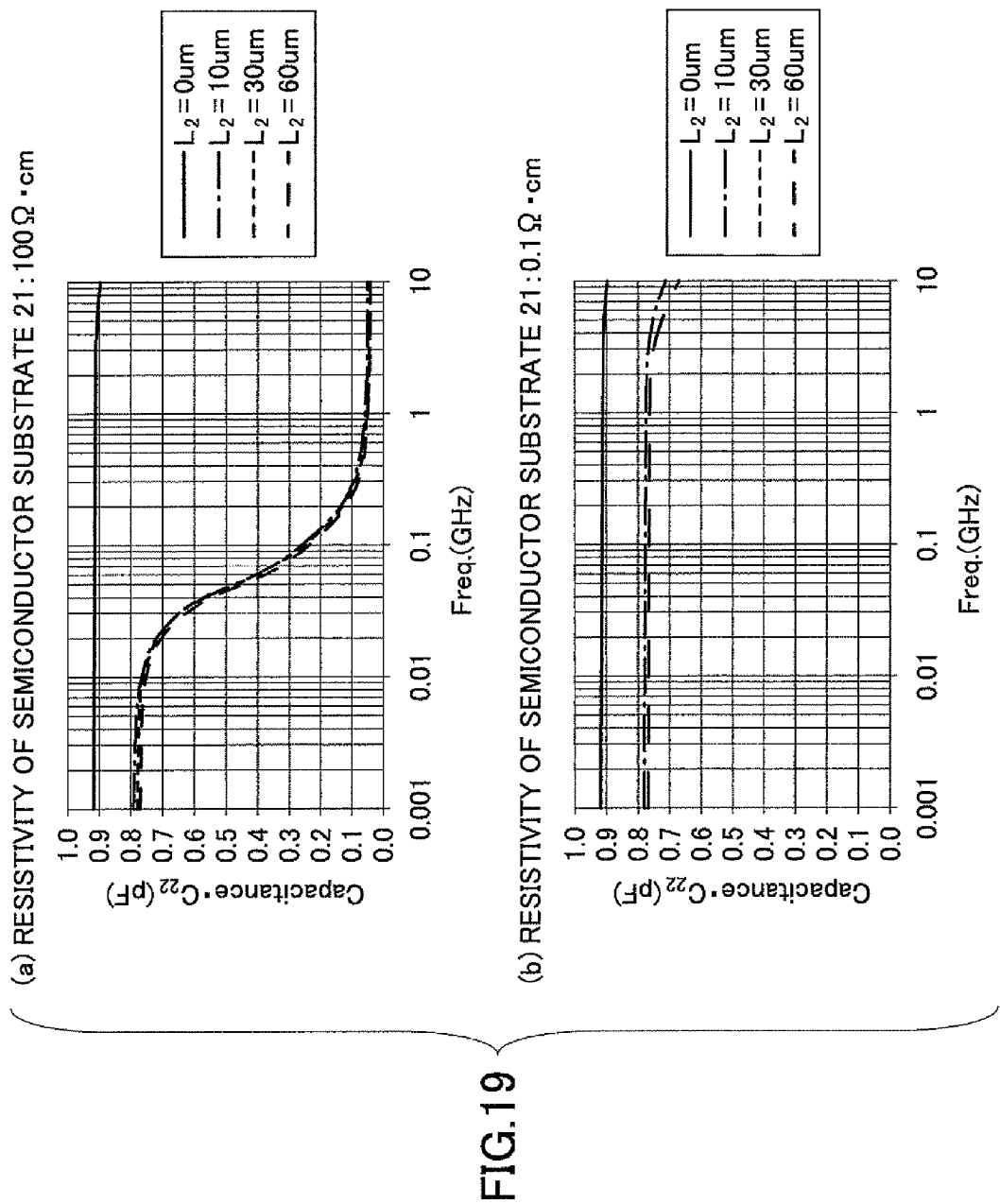
FIG. 19 is a graph showing a result of capacitance simulation.

As shown in FIG. 19, regardless of resistivity of the semiconductor substrate 21, the capacitance $C_{22}$ of the insulation film 22 in a case of "$L_2$=10 μm, 30 μm, or 60 μm" is smaller than the capacitance $C_{22}$ of the insulation film 22 in a case of "$L_2$=0 μm". Hence, the high frequency characteristics in a case of "$L_2$=10 μm, 30 μm, or 60 μm" are better than the high frequency characteristics in a case of "$L_2$=0 μm". The change of the frequency characteristics in a case of "$L_2$=10 μm, 30 μm, or 60 μm" when the resistivity of the semiconductor substrate 21 is greater, is greater than that when the resistivity of the semiconductor substrate 21 is smaller. In the cases of "$L_2$=10 μm, 30 μm, and 60 μm", the frequency characteristics are substantially the same for all the cases. From the perspective of the high frequency characteristics, it is sufficient that the width $L_2$ be equal to or greater than 10 μm.

Thus, in the semiconductor package 10 of the first embodiment, since the cavity part 26 is provided at the connecting terminal 27 side of the piercing electrode 25, the connecting terminal 27 connecting the semiconductor device 20 and the wiring board 30 to each other can be slightly moved in the X direction and Y direction. In addition, since the cavity part 26 does not pierce the semiconductor substrate 21, the interface between layers does not exist at a portion where the maximum relative strain stress is generated when heat is applied to the semiconductor package 10. As a result of this, even if heat is applied to the semiconductor package 10, stress generated at a connecting part (in the vicinity of the connecting terminal 27) due to a difference of coefficient of thermal expansion between the semiconductor device 20 and the wiring board 30 can be drastically eased. Hence, generation of cracks at the connecting part (in the vicinity of the connecting terminal 27) can be prevented.

In addition, by providing the cavity part 26 between the third metal layer 25a and the semiconductor substrate 21, it is possible to make the capacitance $C_{22}$ of the insulation film 22 small, so that the high frequency characteristics can be improved.

(Modified Example 1 of the First Embodiment)

Figure 20:
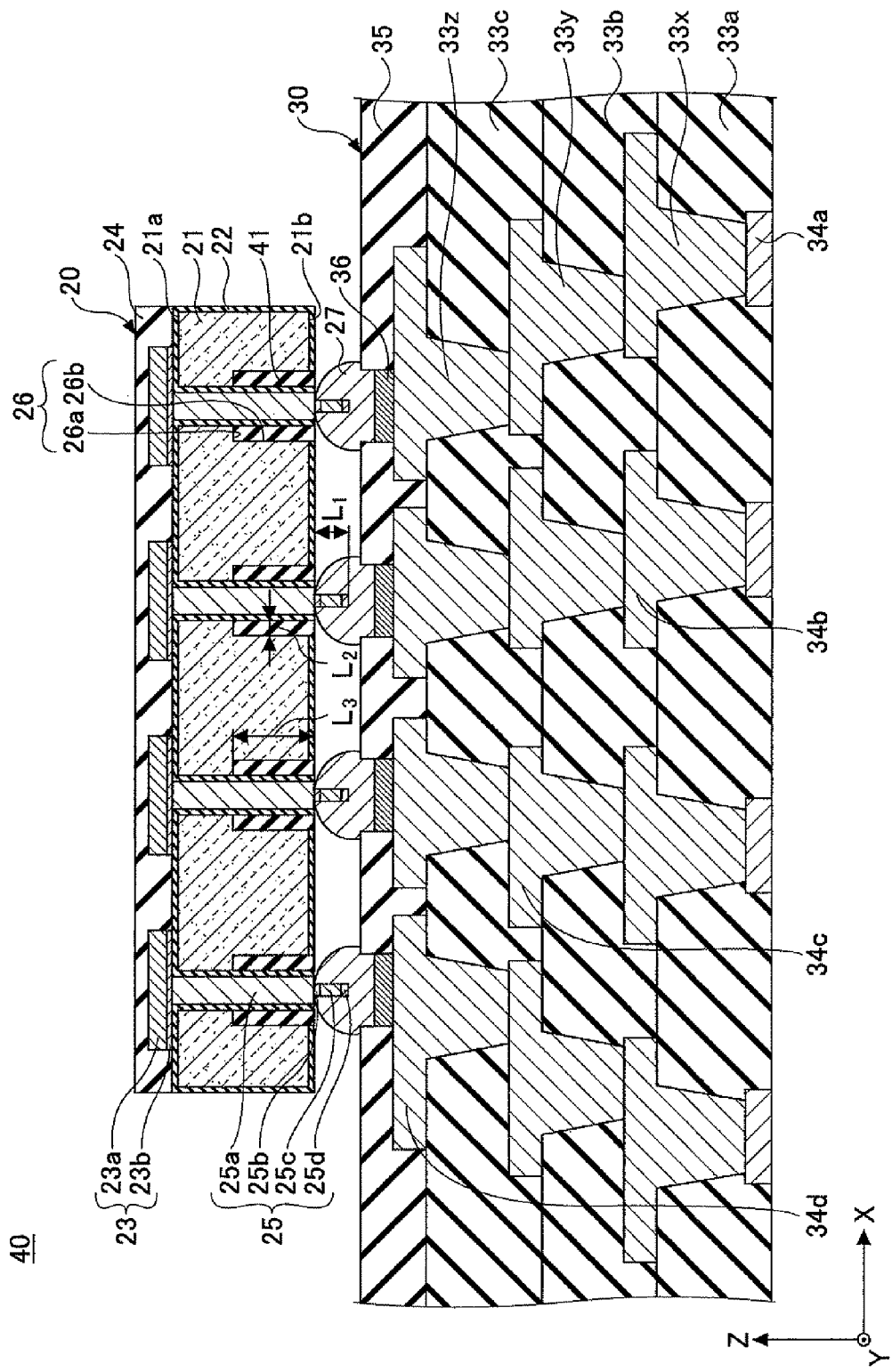
FIG. 20 is a cross-sectional view showing a semiconductor package of a first modified example of the first embodiment of the present invention.

FIG. 20 is a cross-sectional view showing a semiconductor package of a first modified example of the first embodiment of the present invention. In FIG. 20, parts that are the same as the parts of the semiconductor package 10 shown in FIG. 2 are given the same reference numerals, and explanation thereof is omitted. As shown in FIG. 20, a semiconductor package 40 of the modified example 1 of the first embodiment has the same structure as that of the semiconductor package 10 other than that the cavity part 26 is filled with a resin layer 41 in the modified example 1. As the resin layer 41, epoxy group resin, polyimide group resin, or the like can be used.

In the semiconductor package 40, the semiconductor device 20 is electrically and mechanically connected to the wiring board 30 via the connecting terminals 27. The cavity part 26 is provided at the connecting terminal 27 side of the piercing electrode 25. The cavity part 26 is filled with the resin layer 41. Since the resin layer 41 has flexibility, the connecting terminal 27 can be slightly moved in the X direction and the Y direction. In addition, it is possible to reinforce the piercing electrode 25 by supplying the resin layer 41 into the cavity part 26.

As discussed above, when heat is applied to the semiconductor package 300 shown in FIG. 1, due to such difference of the coefficients of thermal expansion, the wiring board 500 is warped more than the semiconductor substrate 410. Therefore, stress may be generated at a connecting part in the vicinity of the connecting terminal 430, the connecting part being configured to connect the semiconductor substrate 410 and the wiring board 500 to each other. However, in this embodiment, since the connecting terminal 27 can be slightly moved in the X direction and the Y direction, stress generated at the connecting part (in the vicinity of the connecting terminal 27) can be drastically eased. Accordingly, it is possible to prevent cracks from being generated at the connecting part (in the vicinity of the connecting terminal 27).

The semiconductor package 40 of the modified example 1 of the first embodiment can be manufactured by a process having steps the same as those shown in FIG. 3 through FIG. 13 and a step of supplying the resin layer 41 such as epoxy group resin into the cavity part 26 after the step shown in FIG. 10.

The semiconductor package 40 of the modified example 1 of the first embodiment achieves the same effect as that achieved by the semiconductor package 10 of the first embodiment and also an effect where the piercing electrode 25 can be reinforced by supplying the resin layer 41 into the cavity part 26.

(Modified Example 2 of the First Embodiment)

Figure 21:
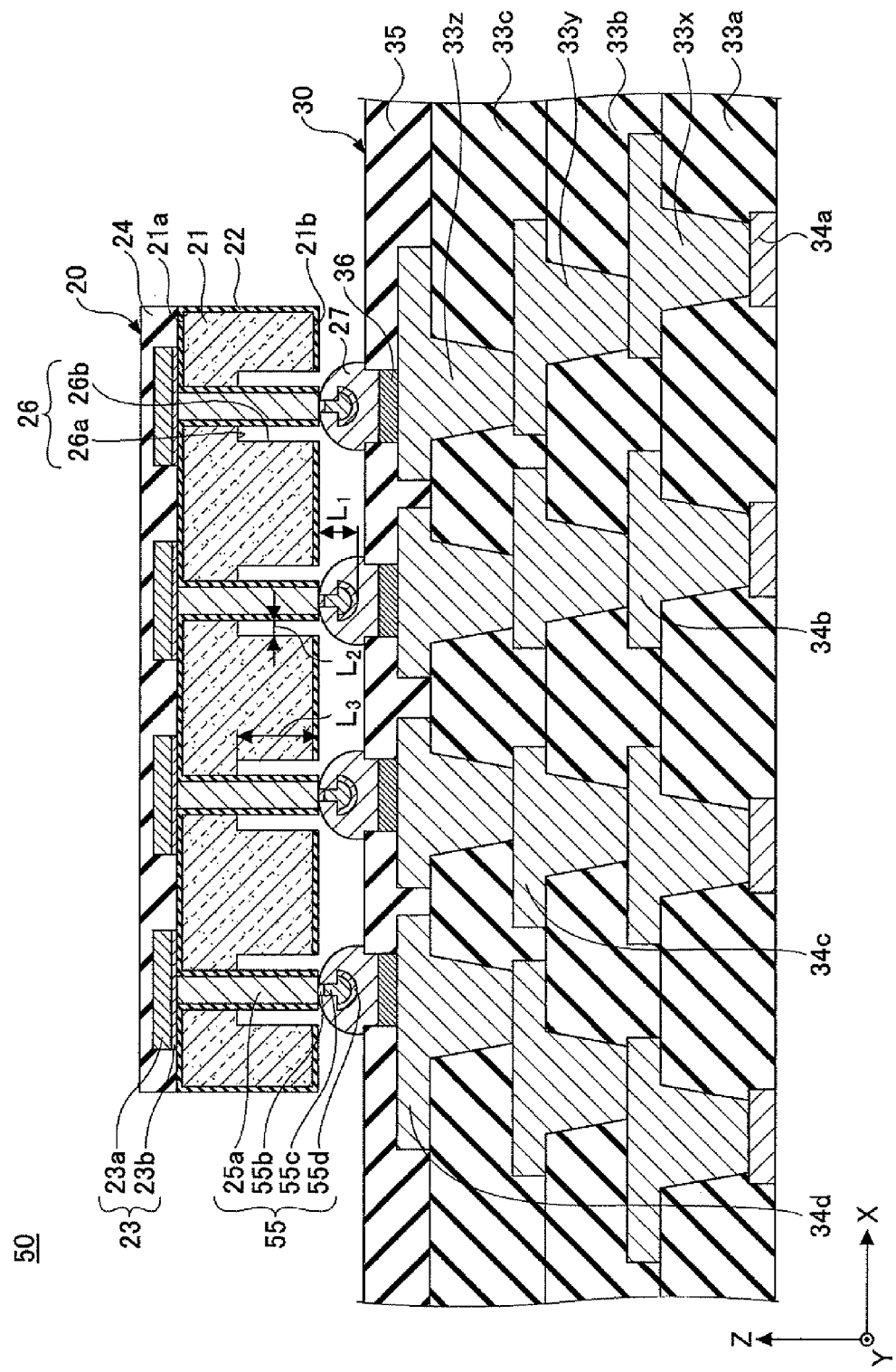
FIG. 21 is a cross-sectional view showing a semiconductor package of a second modified example of the first embodiment of the present invention.

FIG. 21 is a cross-sectional view showing a semiconductor package of a second modified example of the first embodiment of the present invention. In FIG. 21, parts that are the same as the parts of the semiconductor package 10 shown in FIG. 2 are given the same reference numerals, and explanation thereof is omitted. As shown in FIG. 21, a semiconductor package 50 of the modified example 2 of the first embodiment has the same structure as that of the semiconductor package 10 other than that a piercing electrode 55 is provided instead of the piercing electrode 25 in the semiconductor package 50 of the modified example 2.

The piercing electrode 55 pierces from the surface 21a to the surface 21b of the semiconductor substrate 21. The piercing electrode 55 includes the third metal layer 25a, a fourth metal layer 55b, a fifth metal layer 55c, and the sixth metal layer 55d. One end (the third metal layer 25a) of the piercing electrode 55 is electrically connected to the wiring layer 23. Another end (the fourth metal layer 55b, the fifth metal layer 55c, and the sixth metal layer 55d) of the piercing electrode 55 projects compared to the position of the surface 21b of the semiconductor substrate 21. The projecting amount (namely a length of a projecting part) $L_1$ of the end of the piercing electrode 55 can be, for example, approximately 50 μm. The pitch of the piercing electrodes 55 can be properly selected and set to be, for example, approximately 200 μm.

The fourth metal layer 55b, the fifth metal layer 55c, and the sixth metal layer 55d forming in part the piercing electrode 55 form a bump having a so-called mushroom-shaped configuration. The mushroom-shaped bump connects the piercing electrode 55 and the connecting terminal 27 with a low resistance so as to improve the connecting properties between the piercing electrode 55 and the connecting terminal 27.

The sixth metal layer 55d has a circular-shaped configuration in a planar view (seen from the surface 21b side of the semiconductor substrate 21) having a diameter of, for example, approximately 100 μm. In a planar view (seen from the surface 21b side of the semiconductor substrate 21), the fourth metal layer 55b, the fifth metal layer 55c, and the sixth metal layer 55d are provided, for example, in the vicinity of the center part of the third metal layer 25a.

As a material of the fourth metal layer 55b, for example, Ti or the like can be used. The thickness of the fourth metal layer 55b can be, for example, approximately 100 nm. As a material of the fifth metal layer 55c, for example, Cu or the like can be used. The thickness of the fifth metal layer 55c can be, for example, approximately 45 nm. As a material of the sixth metal layer 55d, for example, Au or the like can be used. The sixth metal layer 55d may be, for example, a Ni/Au layer where Ni and Au are stacked, in this order, on the fifth metal layer 55c or a Ni/Pd/Au layer where Ni, Pd, and Au are stacked, in this order, on the fifth metal layer 55c. In addition, forming the sixth metal layer 55d is not mandatory. In a case where the Ni/Pd/Au layer is used as the sixth metal layer 55d, for example, the thickness of the Ni layer can be approximately 1 μm, the thickness of the Pd layer can be approximately 1 μm, and the thickness of the Au layer can be approximately 0.05 μm.

The semiconductor package 50 of the modified example 2 of the first embodiment achieves the same effect as that achieved by the semiconductor package 10 of the first embodiment and also the following effect. That is, the fourth metal layer 55b, the fifth metal layer 55c, and the sixth metal layer 55d forming in part the piercing electrode 55 form a bump having a so-called mushroom-shaped configuration. The mushroom-shaped bump connects the piercing electrode 55 and the connecting terminal 27 with a low resistance so as to improve the connecting properties between the piercing electrode 55 and the connecting terminal 27.

(Modified Example 3 of the First Embodiment)

Figure 22:
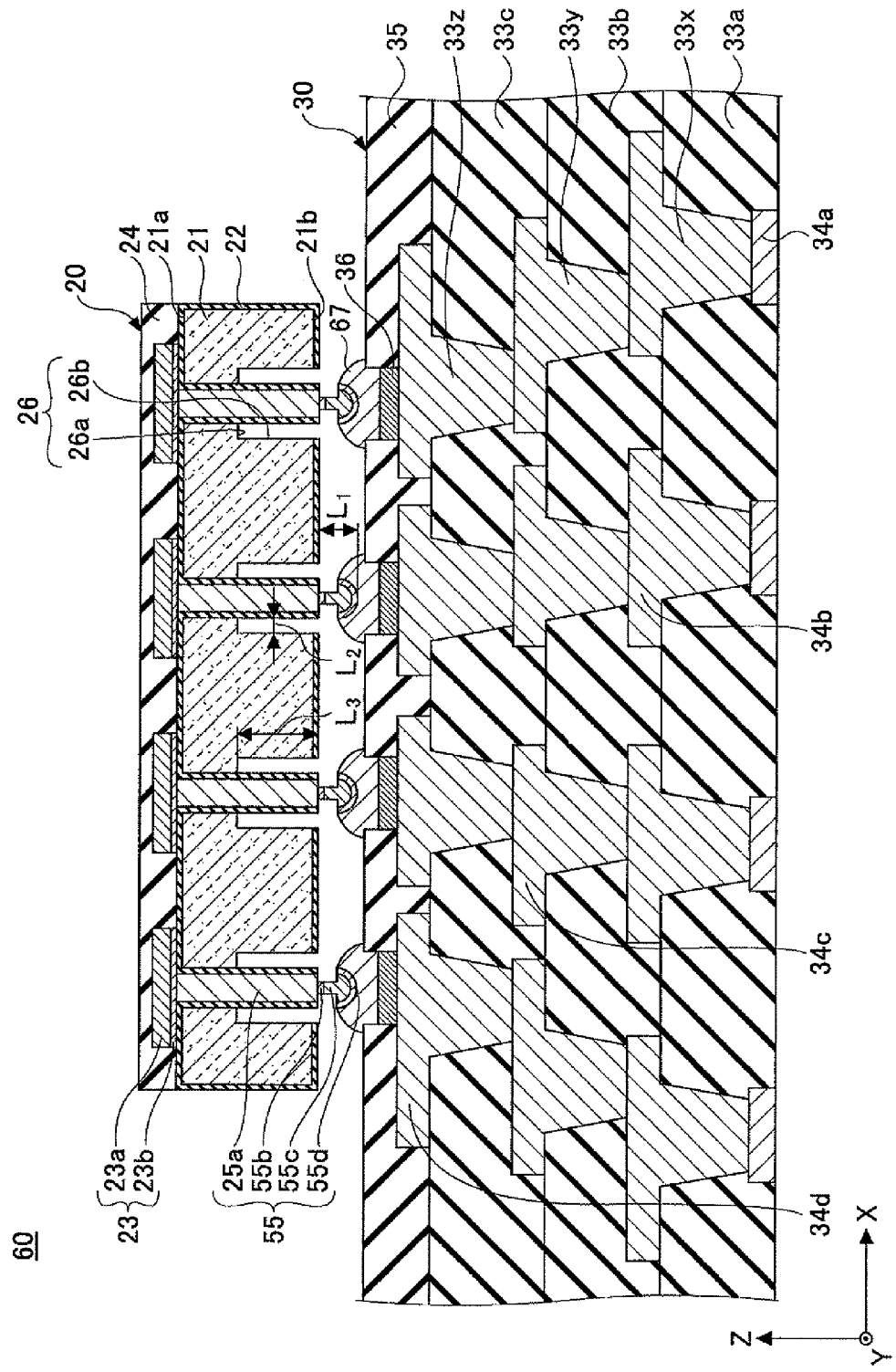
FIG. 22 is a cross-sectional view showing a semiconductor package of a third modified example of the first embodiment of the present invention.

FIG. 22 is a cross-sectional view showing a semiconductor package of a third modified example of the first embodiment of the present invention. In FIG. 22, parts that are the same as the parts shown in FIG. 21 are given the same reference numerals, and explanation thereof is omitted. As shown in FIG. 22, a semiconductor package 60 of the modified example 3 of the first embodiment has the same structure as that of the semiconductor package 50 of the modified example 2 of the first embodiment other than that a connecting terminal 67 is provided instead of the connecting terminal 27 in the semiconductor package 50 of the modified example 3. The configuration of the connecting terminal is not limited to the configuration of the connecting terminal 27 shown in FIG. 21 and may be the configuration of the connecting terminal 67 shown in FIG. 22. The semiconductor package 60 of the modified example 3 of the first embodiment achieves the same effect as that achieved by the semiconductor package 50 of the modified example 2 of the first embodiment.
(Second Embodiment)

Figure 23:
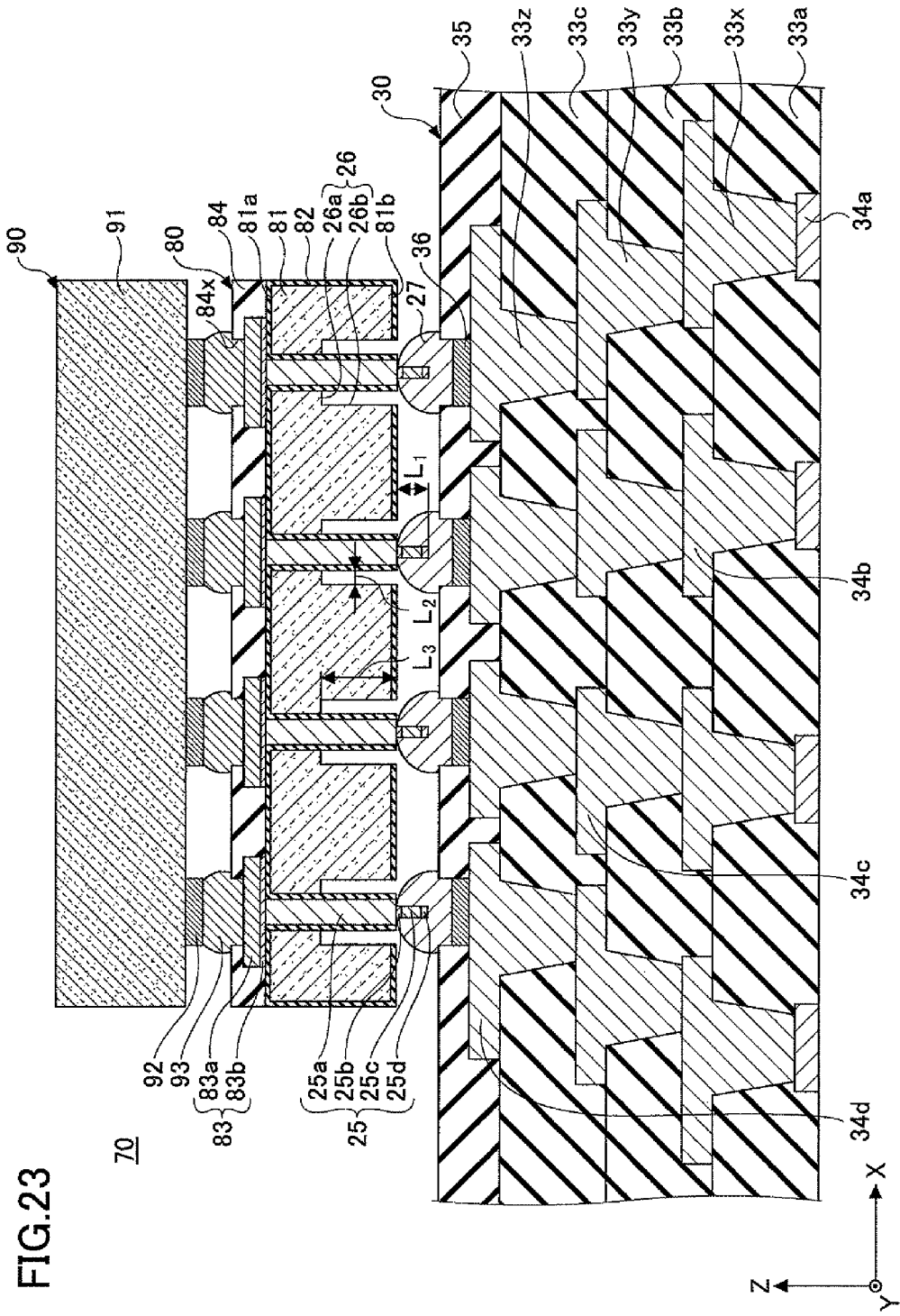
FIG. 23 is a cross-sectional view of a semiconductor package of a second embodiment of the present invention.

First, a structure of a semiconductor package of the second embodiment of the present is discussed with reference to FIG. 23. FIG. 23 is a cross-sectional view of a semiconductor package of the second embodiment of the present invention. In FIG. 23, parts that are the same as the parts shown in FIG. 2 are given the same reference numerals, and explanation thereof is omitted.

As shown in FIG. 23, a semiconductor package 70 of the second embodiment includes an interposer 80, a semiconductor device 90, and the wiring board 30. The interposer 80 includes a substrate 81, an insulation film 82, electrode pads 83, an insulation layer 84, the piercing electrodes 25, the cavity parts 26, and the connecting terminals 27. Silicon, resin (for example, insulation resin), metal (for example, Cu) or the like, for example, can be used as a material of the substrate 81. The thickness of the substrate 81 may be, for example, approximately 200 μm. A size and a configuration of the semiconductor substrate 21 (planar view) may be a rectangular-shaped configuration where the length of the side is approximately 20 mm.

The insulation film 82 covers a surface of the substrate 81 excluding a bottom surface 26a and a wall surface 26b of the cavity part 26. The insulation film 82 insulates between the substrate 81 and the electrode pads 83 or the like. For example, an oxide film such as a thermal oxidation film can be used as the insulation film 82. In a case where the thermal oxidation film is used as the insulation film 82, the thickness of the insulation film 82 can be, for example, approximately 1.5 μm. If the insulation resin is used as the material of the substrate 81, the insulation film 82 is not required.

The electrode pad 83 includes a first metal layer 83a and a second metal layer 83b. The electrode pad 83 is formed on a surface 81a of the semiconductor substrate 81 via the insulation film 82. Cu or the like, for example, can be used as a material of the first metal layer 83a. The thickness of the first metal layer 83a can be, for example, approximately 5 μm. Ti or the like, for example, can be used as a material of the second metal layer 83b. The thickness of the second metal layer 83b can be, for example, approximately 100 μm.

The insulation layer 84 is formed on the surface 81a of the semiconductor substrate 81 via the insulation film 82 so as to cover the electrode pad 83. The insulation layer 84 includes opening parts 84x exposing parts of the electrode pads 83. As a material of the insulation layer 84, for example, polyimide group resin or the like can be used. The thickness of the insulation layer 84 can be, for example, approximately 10 μm.

The piercing electrode 25 is provided in the substrate 81 so as to pierce from the surface 81a to another surface 81b of the substrate 81. Details of the piercing electrode 25 are as discussed above. The cavity part 26 is provided in the substrate 81 so as to expose the insulation film 82 formed on the side surface of the third metal layer 25a forming in part the piercing electrode 25. Details of the cavity part 26 are as discussed above. The connecting terminal 27 is provided on the fourth metal layer 25b, the fifth metal layer 25c, and the sixth metal layer 25d. The connecting terminal 27 is electrically connected to the metal layer 36 of the wiring substrate 30. Details of the connecting terminal 27 are as discussed above.

The semiconductor device 90 includes a semiconductor substrate 91, electrode pads 92, and connecting terminals 93. The semiconductor substrate 91 includes a semiconductor integrated circuit (not shown in FIG. 23). Silicon or the like, for example, can be used as a material of the semiconductor substrate 91. The connecting terminals 93 are provided on the electrode pads 92. The connecting terminal 93 is electrically connected to the electrode pad 83 exposed via the opening part 84x of the interposer 80. A solder ball, an Au bump, a conductive paste, and others can be used as the connecting terminal 93. In a case where the solder ball is used as the connecting terminal 93, for example, an alloy including Pb, an alloy of Sn and Bi, an alloy of Sn and Cu, an alloy of Sn and Ag, an alloy of Sn, Ag, and Cu, or the like can be used as a material of the connecting terminal 93.

The connecting terminals 93 of the semiconductor device 90 are electrically and mechanically connected to the metal layers 36 of the wiring board 30 via the electrode pads 83 of the interposer 80, the piercing electrodes 25, and the connecting terminals 27. In the meantime, since the cavity parts 26 are provided at the connecting terminal 27 side of the piercing electrodes 25, the connecting terminals 27 can be slightly moved in the X direction and the Y direction.

As discussed above, when heat is applied to the semiconductor package 300 shown in FIG. 1, due to such difference of the coefficients of thermal expansion, the wiring board 500 is warped more than the semiconductor substrate 410. Therefore, stress may be generated at a connecting part in the vicinity of the connecting terminal 430, the connecting part being configured to connect the semiconductor substrate 410 and the wiring board 500 to each other. However, in this embodiment, since the connecting terminals 27 can be slightly moved in the X direction and the Y direction, stress generated at the connecting part (the connecting terminal 93, the electrode pad 83, the piercing electrode 25, and the connecting terminal 27) can be drastically eased. Accordingly, it is possible to prevent cracks from being generated at the connecting part (the connecting terminal 93, the electrode pad 83, the piercing electrode 25, and the connecting terminal 27).

The interposer 80 forming in part the semiconductor package 70 of the second embodiment can be manufactured by the same manufacturing process as that of the semiconductor device 20 of the first embodiment.

Thus, in the semiconductor package 70 of the second embodiment, the interposer 80 includes the piercing electrodes 25 and the connecting terminals 27. The semiconductor device 90 and the wiring board 30 are connected to each other via the piercing electrodes 25 and the connecting terminals 27 of the interposer 80. In addition, since the cavity parts 26 are provided at the connecting terminal 27 side of the piercing electrodes 25, the connecting terminals 27 can be slightly moved in the X direction and Y direction. In addition, since the cavity parts 26 do not pierce the substrate 81, the interface between layers does not exist at a portion where the maximum relative strain stress is generated when heat is applied to the semiconductor package 70. As a result of this, even if heat is applied to the semiconductor package 70, stress generated at a connecting part (the connecting terminal 93, the electrode pad 83, the piercing electrode 25, and the connecting terminal 27) due to the difference in coefficients of thermal expansion between the semiconductor device 90 and the wiring board 30 can be drastically eased. Hence, generation of cracks at the connecting part (the connecting terminal 93, the electrode pad 83, the piercing electrode 25, and the connecting terminal 27) can be prevented.

Especially, this structure is effective in a case where it is difficult to directly form the piercing electrode 27 in the semiconductor device 90.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

For example, although the piercing electrode 25 including the third metal layer 25a, the fourth metal layer 25b, the fifth metal layer 25c, and the six metal layer 25d is discusses in the first embodiment, the structure of the piercing electrode is not limited to this example. For example, the piercing electrode may be made of only the third metal layer 25a and the connecting terminal may be directly provided at such a piercing electrode.

In addition, the wiring board forming the semiconductor packages of the above-discussed embodiment is not limited to the wiring board having a built-up wiring layer not including a core part discussed in the above-discussed embodiment. Various wiring boards, such as a single surface (a single layer) wiring board where a wiring layer is formed on the single surface of the substrate, a both surfaces (two layers) wiring board where wiring layers are formed on both surfaces of the substrate, a piercing multi-layer wiring board where the wiring layers are connected to each other via through-holes, a wiring board having a built-up wiring layer including a core part, and an IVH (Interstitial Via Hole) multi-layer wiring board where specific wiring layers are connected to each other via IVHs (Interstitial Via Hole), can be used in the embodiments of the present invention.

The modified examples 1 through 3 of the first embodiment may be applied to the second embodiment.

According to the embodiments of the present invention, it is possible to provide a semiconductor package, whereby stress generated at a connecting part configured to connect a semiconductor device and a wiring board in a case where heat is applied to the semiconductor package is eased so that generation of cracks is prevented, and a manufacturing method of the semiconductor package.

What is claimed is:

1. A semiconductor package, comprising:
a semiconductor device; and
a wiring board where the semiconductor device is mounted,
wherein the semiconductor device includes
    a semiconductor substrate,
    a piercing electrode configured to pierce the semiconductor substrate and electrically connect the wiring board and the semiconductor device, and
    a ring-shaped air gap provided so as to surround the piercing electrode, the ring-shaped air gap being configured to open to a wiring board side of the semiconductor substrate.

2. The semiconductor package as claimed in claim 1, wherein an interface between the piercing electrode and another layer is provided other than at a boundary part between a first portion exposed by the ring-shaped air gap and a second portion not exposed by the ring-shaped air gap.

3. The semiconductor package as claimed in claim 1, wherein an insulation film is formed on a side surface of the piercing electrode exposed by the ring-shaped air gap.

4. The semiconductor package as claimed in claim 1, wherein resin fills the ring-shaped air gap.

5. The semiconductor package as claimed in claim 1, wherein a projecting part is formed at an end part of the piercing electrode, the projecting part projecting from the semiconductor substrate to the wiring board side, and
a connecting terminal is formed on the projecting part.

6. The semiconductor package as claimed in claim 5, wherein the projecting part has a mushroom-shaped configuration.

7. A semiconductor package, comprising:
a semiconductor device; and
a wiring board where the semiconductor device is mounted via an interposer, wherein the interposer includes
    a substrate,
    a piercing electrode configured to pierce the substrate and electrically connect the wiring board and the semiconductor device, and
    a ring-shaped air gap provided so as to surround the piercing electrode, the ring-shaped air gap being configured to open to a wiring board side of the substrate.

* * * * *